(12) United States Patent
Tseng et al.

(10) Patent No.: US 9,136,250 B2
(45) Date of Patent: Sep. 15, 2015

(54) THROUGH SILICON VIA REPAIR CIRCUIT

(71) Applicant: Industrial Technology Research Institute, Hsinchu (TW)

(72) Inventors: Pei-Ling Tseng, Miaoli County (TW); Keng-Li Su, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 284 days.

(21) Appl. No.: 13/902,988

(22) Filed: May 28, 2013

(65) Prior Publication Data

US 2014/0184322 A1    Jul. 3, 2014

(30) Foreign Application Priority Data

Dec. 27, 2012  (TW) .............................. 101150631 A

(51) Int. Cl.
*H03K 19/003*    (2006.01)
*H01L 25/065*    (2006.01)

(52) U.S. Cl.
CPC ... *H01L 25/0657* (2013.01); *H01L 2225/06544* (2013.01); *H01L 2225/06596* (2013.01); *H01L 2924/0002* (2013.01)

(58) Field of Classification Search
CPC ............ H01L 2225/06596; H01L 2225/06544
See application file for complete search history.

(56) References Cited

U.S. PATENT DOCUMENTS

| 6,470,054 | B1 |  | 10/2002 | Boudry et al. |  |
|---|---|---|---|---|---|
| 7,977,962 | B2 |  | 7/2011 | Hargan et al. |  |
| 8,110,892 | B2 |  | 2/2012 | Lee et al. |  |
| 8,339,879 | B2 | * | 12/2012 | Choi et al. | ..................... 365/198 |
| 8,441,831 | B2 | * | 5/2013 | Ku et al. | ......................... 365/63 |
| 8,890,607 | B2 | * | 11/2014 | Huang et al. | .................. 327/565 |
| 8,952,498 | B2 | * | 2/2015 | Shigezane et al. | ............ 257/621 |
| 8,988,130 | B2 | * | 3/2015 | Kim et al. | ..................... 327/365 |

(Continued)

FOREIGN PATENT DOCUMENTS

| JP | 2006330974 | 12/2006 |
|---|---|---|
| TW | 2012001218 | 1/2012 |

(Continued)

OTHER PUBLICATIONS

"Office Action of Taiwan Counterpart Application", issued on Nov. 4, 2014, p. 1-p. 22.

(Continued)

*Primary Examiner* — Thomas J Hiltunen
(74) *Attorney, Agent, or Firm* — Jianq Chyun IP Office

(57) ABSTRACT

A through silicon via (TSV) repair circuit is provided. The TSV repair circuit includes at least two transmission control switches and at least two transmission path modules. Two transmission control switches transmit an input signal of a first chip or a second chip to one of two terminals in each of the transmission path modules according to a switch signal. Each transmission path module includes at least two data path circuits and corresponding TSVs. Each data path circuit includes an input driving circuit, a short-circuit detection circuit and a leakage current cancellation circuit. The short-circuit detection circuit detects whether to detect whether short-circuit on the TSV and a silicon substrate is present and generate a short-circuit detection output signal. The leakage current cancellation circuit to avoid a leakage current generated by a first level voltage to flow into the silicon substrate according to the short-circuit detection output signal.

53 Claims, 12 Drawing Sheets

(56) References Cited

U.S. PATENT DOCUMENTS

| | | | |
|---|---|---|---|
| 9,013,908 B2* | 4/2015 | Chang et al. | 365/63 |
| 2010/0060310 A1 | 3/2010 | Laisne et al. | |
| 2010/0127758 A1 | 5/2010 | Hollis | |
| 2010/0295600 A1 | 11/2010 | Kim et al. | |
| 2011/0128072 A1 | 6/2011 | Choi et al. | |
| 2011/0156034 A1 | 6/2011 | Cui et al. | |
| 2011/0309359 A1 | 12/2011 | Saen et al. | |
| 2012/0212272 A1 | 8/2012 | Yokou et al. | |
| 2012/0319757 A1* | 12/2012 | Sato | 327/419 |
| 2013/0241314 A1* | 9/2013 | Yun et al. | 307/125 |
| 2014/0145753 A1* | 5/2014 | Tseng et al. | 326/9 |
| 2014/0185174 A1* | 7/2014 | Tseng et al. | 361/91.1 |
| 2014/0340113 A1* | 11/2014 | Tseng et al. | 326/9 |

FOREIGN PATENT DOCUMENTS

| | | |
|---|---|---|
| TW | 201248777 | 12/2012 |
| WO | 2010110244 | 9/2010 |

OTHER PUBLICATIONS

Kang et al., "8 Gb 3-D DDR3 Dram Using Through-Silicon-Via Technology", IEEE Journal of Solid-State Circuits, Jan. 2010, vol. 45, p. 111-p. 119.

Liu et al., "A Compact Low-Power 3D I/O in 45nm CMOS", 2012 IEEE International Solid-State Circuits Conference, Feb. 21, 2012, p. 142-p. 144.

Huang et al., "Built-in Self-Test/Repair Scheme for TSV-Based Three-Dimensional Integrated Circuits", 2010 IEEE Asia Pacific Conference on Circuits and Systems (APCCAS), Dec. 2010, p. 56-p. 59.

Tsai et al, "Through Silicon Via(TSV) Defect/Pinhole Self Test Circuit for 3D-IC", IEEE International Conference on 3D System Integration, Sep. 2009, p. 1-p. 8.

Hsieh et al, "TSV Redundancy: Architecture and Design Issues in 3D IC", Design, Automation & Test in Europe Conference & Exhibition, Mar. 2010, p. 166-p. 171.

* cited by examiner

THROUGH SILICON VIA REPAIR CIRCUIT

CROSS-REFERENCE TO RELATED APPLICATION

This application claims the priority benefit of Taiwan application serial no. 101150631, filed on Dec. 27, 2012. The entirety of the above-mentioned patent application is hereby incorporated by reference herein and made a part of this specification.

TECHNICAL FIELD

The disclosure relates to a technique for stacking integrated circuits (ICs), and relates to a through silicon via (TSV) repair circuit of a semiconductor apparatus.

BACKGROUND

With rapid growing of transistors amount in an integrated circuit (IC), areas of chip being used is increased accordingly, resulting problems such as delay time and power consumption of signal to get worse each day. In order to improve such critical problem in delay time and power consumption, a three dimensional IC (3DIC) stacking technology is an effective solution under development today. The technology performs vertically stacking to a plurality of chips in 3D space, signals and power voltages are transmitted by utilizing through silicon vias (TSVs) being passed through the silicon substrate in between different chips, so as to achieve an optimal effect in size reduction.

Processing technology of the 3DIC mainly focused in three steps: first step includes forming TSV channels and filling a conductive metal; second step includes performing a thinner process to wafers; and third step includes stacking and bonding chips together. In the first step, as restricted by the processing technology at the present stage, an insulating thin film (e.g., SiO2) on sidewalls of TSVs may be broken or invaded by foreign impurity, resulting an open-circuit of the TSVs or a short-circuit of the silicon substrate. Also, in the third step when a plurality of ICs are stacked, due to small position offset, the TSVs may not be correctly turned on to each other, resulting an open-circuit, that is, TSVs may fail to provide effective paths between different chips for transmitting signal.

In conventional 2DIC design, the problem in data transmission may be prevented by utilizing a plurality of paths to transmit the same signal at the same time. However, in 3DIC technology, once one of the TSVs has short-circuit on the silicon substrate, leakage current generated by power voltage may flow into the silicon substrate through the TSV, resulting overall voltage level in the silicon substrate to shift and become unstable, such that errors in transmission may occur since signals transmitted in other TSVs may also be affected by shifted voltage level in the silicon substrate. Therefore, many of manufacturers in 3DIC field are in searching for a bidirectional data transmission circuit with capabilities of automatically detecting short defect of the TSVs and self-repairing data.

In addition, in 3DIC field, other than utilizing the TSVs to perform signal transmission within the chips, it is also required for the 3DIC to transmit signals to circuits outside of the chips through bonding pads. FIG. 1 is a schematic view illustrating a chip inner circuit 10, a bonding pad 20, an output buffer driving circuit 30 and an external circuit 40. In which, an output signal may be transmitted by the output buffer driving circuit 30 to the external circuit 40, or an input signal of the external circuit 40 may be transmitted to the chip inner circuit 10 through the bonding pad 20. As shown in FIG. 1, generally, when a signal transmission is performed by the chip inner circuit 10, the output signal from an output terminal Nout may be clamped by two electrostatic protection diodes D1 and D2 with a power voltage VDD and a ground voltage GND, and the output terminal Nout may be connected to the output buffer circuit 30 for buffering the output signal. The output signal of the chip inner circuit 10 may be transmitted to the external circuit 40 through a resistor R1 and the bonding pad 20, in such case a capacitive loading mounted when transmitting signals from the chip inner circuit 10 to the external circuit 40 is, for example, generally ranged from 20 pf to 40 pf. Therefore, besides the capabilities of automatically detecting short defect of the TSV and self-repairing the data, the bidirectional data transmission circuit is also expected to have sufficient load driving capability to drive the signals to the external circuit.

SUMMARY

The disclosure proposes a TSV repair circuit including a first chip and a second chip, a first transmission control switch and a second transmission control switch, at least two transmission path modules, a first output logical circuit and a second output logical circuit. The first chip and the second chip are stacked on top of each other. The first transmission control switch and the second transmission control switch are respectively disposed on the first chip and the second chip. The first transmission control switch and the second transmission control switch respectively receive a switch signal and an opposite switch signal as to determine whether to inverse an input signal from one of the first chip and the second chip into a first pending signal, transmit the first pending signal to an output terminal and turn off an input signal from another one of the first chip or the second chip. Each of the transmission path modules has two terminals respectively connected to the output terminals of the first transmission control switch and the second transmission control switch, and each of the transmission path modules includes at least one TSV. The first output logical circuit and the second output logical circuit are respectively disposed on the second chip and the first chip. At least two input terminals of the first output logical circuit and the second output logical circuit are respectively connected to a second terminal and a first terminal of the at least one TSV, so as to respectively receive at least two first transmission signals and at least two second transmission signals, so the output terminals of the first output logical circuit and the second output logical circuit respectively may generate a first output signal and a second output signal.

In one embodiment, each of the transmission path modules includes at least one TSV, a first and a second data path circuits. Each TSV respectively passes through a silicon substrate to transmit signals between the first chip and the second chip. The first data path circuit and the second data path circuit are respectively disposed on the first chip and the second chip. Input terminals of the first and the second data path circuits are respectively connected to the output terminals of the first transmission control switch and the second transmission control switch to receive the first pending signal. Output terminals of the first data path circuit and the second data path circuit are connected to a corresponding terminal of the at least one TSV, so as to transmit data through the TSV according to one of the switch signal and the opposite switch signal.

In one embodiment, the first data path circuit and the second data path circuit respective includes an input driving circuit, a short-circuit detection circuit and a leakage current cancellation circuit. The input driving circuit receives the input signal, inverses the first pending signal into a second pending signal according to a first level voltage and a second level voltage, and transmits the second pending signal to a corresponding terminal of the TSV. The short-circuit detection circuit connects the corresponding terminal of the TSV to detect whether short-circuit on the TSV and a silicon substrate is present according to the first pending signal and a level of the corresponding terminal of the TSV and generate a short-circuit detection output signal. The leakage current cancellation circuit connects the short-circuit detection circuit and the input driving circuit to avoid a leakage current generated by the first level voltage to flow into the silicon substrate according to the short-circuit detection output signal.

In one embodiment of the disclosure, the disclosure provides a TSV repair circuit, including a plurality of chips, a first transmission control switch and a second transmission control switch, at least two TSVs, at least two data path modules and a plurality of output logical circuits. The plurality of chips are stacked on top of each other, and the plurality of chips include a first chip and a second chip. The first transmission control switch and the second transmission control switch are respectively disposed on the first chip and the second chip. The first and the second transmission control switches respectively receive a switch signal and an opposite switch signal as to determine whether to inverse an input signal from one of the first chip or the second chip into a first pending signal and turn off an input signal from another one of the first chip or the second chip. The TSVs respectively pass through a silicon substrate to transmit signals between the plurality of chips.

In one embodiment, each of the data path module is respectively disposed on the first chip and the second chip. Each of the data path modules includes at least two data path circuits having a same input terminal, the input terminal of each of the data path circuits is connected to output terminals of the first and the second transmission control switches respectively to receive the first pending signal. The output terminal of each of the data path circuits is connected to terminals of the at least two TSVs in a corresponding chip leading to a corresponding chip, so as to transmit data through the at least two TSVs according to the switch signal or the opposite switch signal. The output logical circuits are respectively disposed on any one chip. At least two input terminals of each of the output logical circuits are connected to terminals of the TSVs at the same side in the any one chip to receive at least two transmission signals and respectively generate the output signals.

In one embodiment, each data path circuit includes an input driving circuit, a short-circuit detection circuit and a leakage current cancellation circuit. The input driving circuit receives the first pending signal, inverses the first pending signal into a second pending signal according to a first level voltage and a second level voltage and transmits the second pending signal to a corresponding terminal of the TSV. The short-circuit detection circuit connects the corresponding terminal of the TSV to detect whether short-circuit on the TSV and a silicon substrate is present according to the first pending signal and a level of the corresponding terminal of the TSV and generate a short-circuit detection output signal. The leakage current cancellation circuit connects the short-circuit detection circuit and the input driving circuit to avoid a leakage current generated by the first level voltage to flow into the silicon substrate according to the short-circuit detection output signal.

In one embodiment of the disclosure, the disclosure provides a TSV repair circuit including a plurality of chips, a first transmission control switch and a second transmission control switch, at least two TSVs, at least two data path modules, and a plurality of output logical circuits. The plurality of chips are stacked on top of each other, and the plurality of chips include a first chip and a second chip. The first transmission control switch and the second transmission control switch are respectively disposed on the first chip and the second chip. The first and the second transmission control switches respectively receive a switch signal and an opposite switch signal as to determine whether to inverse an input signal from one of the first chip or the second chip into a first pending signal, transmit the first pending signal to an output terminal and turn off an input signal of another one of the second chip and the first chip. The TSVs respectively pass through a silicon substrate to transmit signals between the plurality of chips.

In one embodiment, the plurality of data path modules are disposed on all chips. Each transmission path module includes at least two data path circuits having a same input terminal. The input terminals of each of the data path modules is connected to the output terminals of the first transmission control switch and the second transmission control switch respectively as to receive the input signal or receive an output signal from a previous-stage chip, and an output terminal of each of the data path circuits in each of the data path modules is connected to terminals of the at least two TSVs leading to a corresponding chip, so as to transmit data through the TSVs according to the switch signal or the opposite switch signal. The plurality of output logical circuits are respectively disposed on all chips. At least two input terminals the output logical circuits are connected to terminals of the TSVs at the same side on the all chips to receive at least two transmission signals and respectively generate the corresponding output signals.

In one embodiment, each data path circuit includes an input driving circuit, a short-circuit detection circuit and a leakage current cancellation circuit. The input driving circuit receives the first pending signal, inverses the first pending signal into a second pending signal according to a first level voltage and a second level voltage and transmits the second pending signal to the corresponding TSV. The short-circuit detection circuit connects the corresponding terminal of the corresponding TSV to detect whether short-circuit on the TSV and a silicon substrate is present according to the first pending signal and a level of the corresponding terminal of the TSV and generate a short-circuit detection output signal. The leakage current cancellation circuit connects the short-circuit detection circuit and the input driving circuit to avoid a leakage current generated by the first level voltage to flow into the silicon substrate according to the short-circuit detection output signal.

To make the above features of the disclosure more comprehensible, several embodiments accompanied with drawings are described in detail as follows.

DETAILED DESCRIPTION

Figure 1:
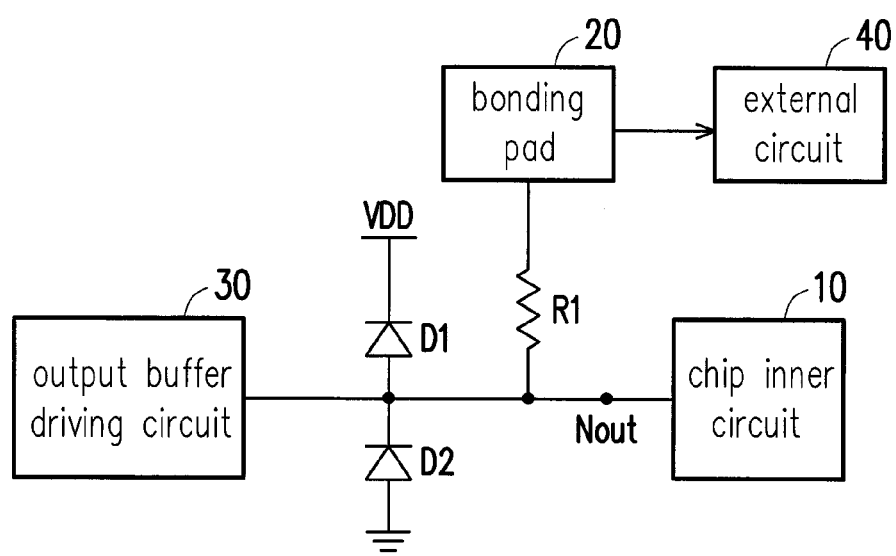
FIG. 1 is a schematic view illustrating a chip inner circuit, a bonding pad, an output buffer driving circuit and an external circuit.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure is directed to a through silicon via (TSV) repair circuit adapted for semiconductor apparatus, which may control data flow between two chips, automatically detect whether a TSV has short-circuit to avoid the leakage current from flowing into a silicon substrate and self-repair a correct output signal based on the signals already transmitted, such that a 3DIC may have sufficient driving capability for correctly and bidirectionally transmitting data.

The TSV repair circuit of the embodiment utilizes two transmission control switches, one of a switch signal and an opposite switch signal to transmit data bidirectional in a plurality of chips, and whether short-circuit on a TSV and the silicon substrate is present may be determined according to the input signal, switch signal and a level of the TSV. Once short-circuit on the TSV is present, the TSV repair circuit may turn off the power voltage and/or connect the TSV to the ground voltage, so as to avoid the leakage current to flow into the silicon substrate thereby preventing the voltage level in the silicon substrate to shift. Each of the output logical circuits may also self-repair the output signals into correct ones according to a plurality of transmission signals already transmitted, which allows the semiconductor apparatus (e.g., 3DIC) to bidirectional transmit data correctly even if a partial of the TSVs is in a short-circuit condition. In addition, the first and the second transmission control switches of the disclosure may provide a sufficient driving capability to the input signal to be transmitted, such that the signal may be transmitted to an external circuit through bonding pads.

Figure 2:
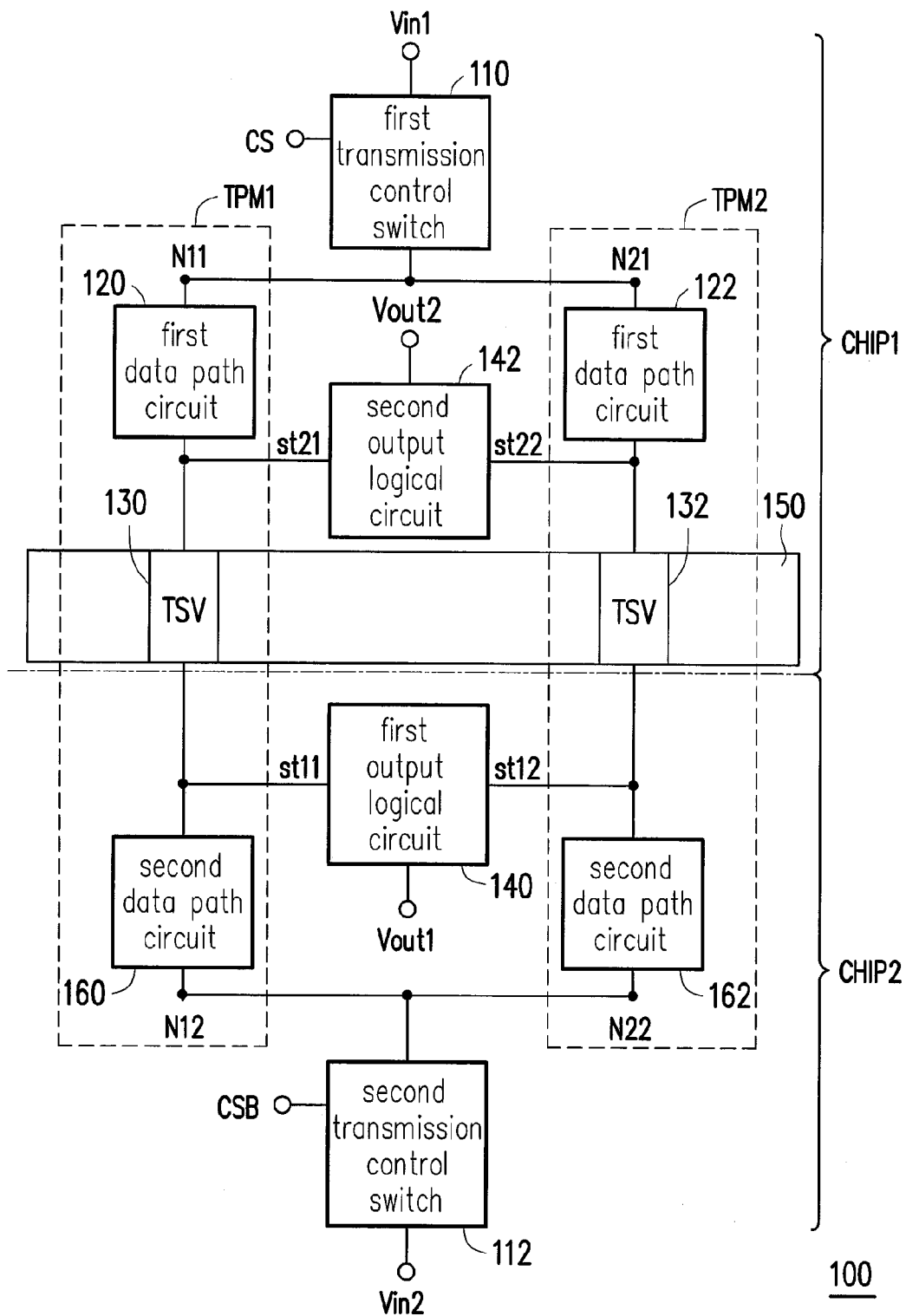
FIG. 2 is a schematic view illustrating a through silicon via (TSV) repair circuit according to a first embodiment of the disclosure.

FIG. 2 is a schematic view illustrating a through silicon via (TSV) repair circuit 100 according to a first embodiment of the disclosure. As shown in FIG. 2, the TSV repair circuit 100 adapted to a semiconductor apparatus includes at least two chips CHIP1 and CHIP2 stacked on top of each other, a first transmission control switch 110 and a second transmission control switch 112, at least two transmission path modules TPM1 and TPM2, a first output logical circuit 140 and a second output logical circuit 142.

Despite that the first chip CHIP1 and the second chip CHIP2 are disclosed as being stacked on top of each other in FIG. 2, the disclosure may also be implemented with a semiconductor apparatus (e.g., three dimensional chip) formed by a plurality of chips stacked on top of each other while having two chips for transmitting data to be used respectively as the first chip CHIP1 and the second chip CHIP2, whereas other chips with one or more layers may also be provided between the first chip CHIP1 and the second chip CHIP2.

The first transmission control switch 110 is disposed on the first chip CHIP1 and the second transmission control switch 112 is disposed on the second chip CHIP2. According to the embodiment, a transmission direction of signals may be selected by one of a switch signal CS and an opposite switch signal CSB. That is, in the embodiment, an input signal Vin1 of the first chip CHIP1 may be transmitted to the first output logical circuit 140 of the second chip CHIP2, or an input signal Vin2 of the second chip CHIP2 may be transmitted to the second output logical circuit 142 of the first chip CHIP1, selectively. Since the TSV repair circuit 100 is not capable of performing a bidirectional transmission to the input signal Vin1 and the input signal Vin2 at the same time, thus when the input signal Vin1 is selected for transmission, the first transmission control switch 110 may be turned on to invert the input signal Vin1 into a first pending signal, and transmit the first pending signal to an output terminal of the first transmission control switch 110. The input signal Vin2 of the second chip CHIP2 may be turned off by the second transmission control switch 112 to avoid the input signal Vin2 from being transmitted to an output terminal of the second transmission control switch 112. Alternatively, when the input signal Vin2 is selected for transmission, the first transmission control switch 110 may be turned off and the second transmission control switch 112 may turned on, so as to transmit the first pending signal generated from inverting the input signal Vin2 to the output terminal of the second transmission control switch 112.

The at least two transmission path module of the disclosure are illustrated by using transmission path modules TPM1 and TPM2 as shown in FIG. 2. However, the disclosure may be implemented by using other transmission path modules additionally, so as to improve accuracy of a bidirectional data transmission. First terminal (i.e., N11 and N21) of two terminals in each of the transmission path modules TPM1 and TPM2 is connected to the output terminal of the first transmission path module 110, another terminal (i.e., N12 and N22) of two terminals in each of the transmission path modules TPM1 and TPM2 is connected to the output terminal of the second transmission path module 112. Each of the transmission path modules TPM1 and TPM2 includes at least one TSV (e.g., 130 and 132). The TSVs 130 and 132 respectively pass through a silicon substrate 150 to transmit signals between the first chip CHIP1 and the second chip CHIP2. In case when the disclosure is implemented with the semiconductor apparatus (e.g., three dimensional chip (3DIC)) formed by the plurality of chips stacked on top of each other, the TSVs 130 and 132 may respectively pass through a silicon substrate with a corresponding number of layers located between the first chip CHIP1 and the second chip CHIP2. After the first pending signal is received by each of the transmission path modules TPM1 and TPM2 according to the transmission direction of signals, the input signal Vin1 of the first chip CHIP1 or the input signal Vin2 of the second chip CHIP2 may be transmitted to another chip through the TSVs 130 and 132.

General application of the embodiment may transmit data by using one single transmission path module (TPM1 or TPM2) including one single TSV (130 or 132). Due to difference in process yield, a sidewall of one single TSV is prone to break and invaded by foreign impurity, such that data may be electrically connected to the silicon substrate 150 when passing through the TSV for resulting an unstable data transmission. Therefore, the embodiment may be implemented by using one single transmission path module (TPM1 or TPM2) having one or more TSVs (e.g., more than two TSVs) according to practical needs for a stable data transmission. For instance, the transmission path module TPM1 may include a plurality of TSVs 130 for transmitting data at the same time.

The first output logical circuit 140 and the second output logical circuit 142 are respectively disposed on the second chip CHIP2 and the first chip CHIP1. Input terminals of the first output logical circuit 140 and the second output logical circuit 142 are respectively connected to second terminals and first terminals of the TSVs 130 and 132 to respectively receive at least two first transmission signals and at least two second transmission signals, so as to respectively generate a first output signal and a second output signal. More specifically, the input terminal of the first output logical circuit 140 is connected to the second terminal of the TSV (130 or 132) located at the second chip CHIP2, once the output signal Vin1 is transmitted from the first chip CHIP1 to the second chip CHIP2, the first output logical circuit 140 may receive the at least two first transmission signals (e.g., first transmission signals st11 and st12) respectively through the TSV (130 or 132) of the transmission path module (TPM1 or TPM2) and generate the first output signal Vout1 according to the first transmission signals st11 and st12. The input terminal of the second output logical circuit 142 connects the first terminals of the TSVs (130 or 132) located at the first chip CHIP1, once the output signal Vin2 is transmitted from the second chip CHIP2 to the first chip CHIP1, the second output logical circuit 142 may receive the at least two second transmission signals (e.g., the second transmission signals st21 and st22) respectively through the TSV (130 or 132) of the transmission path module (TPM1 or TPM2) and generate a second output signal Vout2 according to the second transmission signals st21 and st22. When other transmission path modules are used to improve accuracy in transmission, a number of the input terminals of the first output logical circuit 140 is equal to a number of the transmission path modules, such that the first transmission signal Vout1 may be calculated by a corresponding number of the first transmission signals respectively received from the second terminals of the TSVs located at the second chip CHIP2 in the transmission path modules; and the second transmission signal Vout2 may be calculated by a corresponding number of the second transmission signals respectively received from the first terminals of the TSVs located at the first chip CHIP1 in the transmission path modules.

The transmission path modules TPM1 and TPM2 and inner devices therein are described as below. Referring to FIG. 1, the transmission path module (TPM1 or TPM2) includes at least one TSV (130 or 132), a first data path circuit (120 or 122) and a second data path circuit (160 or 162). The first data path circuit (120 or 122) is disposed on the first chip CHIP1 and the second data path circuit (160 or 162) is disposed on the second chip CHIP2. An input terminal (N11 or N21) of the first data path circuit (120 or 122) is connected to the output terminal of the first transmission control switch 110 to receive the first pending signal generated by the first transmission control switch 110. An input terminal (N12 or N22) of the second data path circuit (160 or 162) is connected to the output terminal of the second transmission control switch 112 to receive the first pending signal generated by the second transmission control switch 112. The output terminal of the first data path circuit (120 or 122) is respectively connected to the first terminal of the TSV (130 or 132) located at the first chip CHIP1, whereas the output terminal of the second data path circuit (160 or 162) is respectively connected to the second terminal of the TSV (130 or 132) located at the second chip CHIP2. Accordingly, the first data path circuit (120 or 122) and the second data path circuit (160 or 162) in the transmission path module (TPM1 or TPM2) may respectively transmit data bidirectionally through the TSV (130 or 132) according to the transmission direction of signals determined by the switch signal CS.

Figure 3:
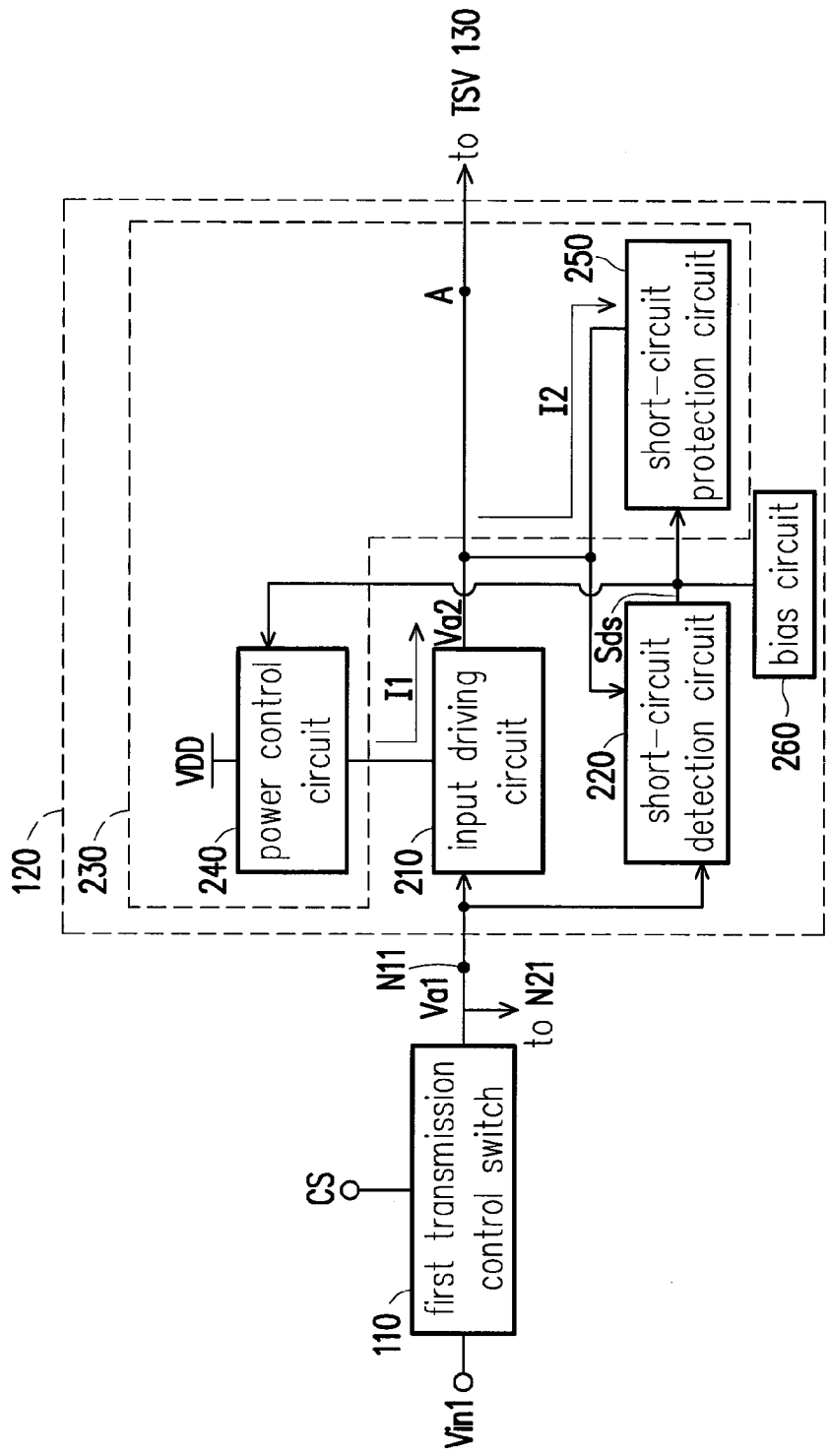
FIG. 3 is a functional block view illustrating the first transmission control switch and the first data path circuit depicted in FIG. 2.

In FIG. 2, the first data path circuits 120 and 122 and the second data path circuits 160 and 162 are of a similar circuit structure, whereas the first transmission control switch 110 and the second transmission control switch 112 are also of a similar circuit structure. Therefore, according to the embodiment, the first data path circuit 120 and the second data path circuit 110 depicted in FIG. 2 are described in detail, other data path circuits 122, 162 and 162 may be implemented with reference to the first data path circuit 120, whereas the second transmission control switch 112 may be implemented with reference to the first transmission control switch 110. FIG. 3 is a functional block view illustrating the first transmission control switch 110 and the first data path circuit 120 depicted in FIG. 2.

Referring to FIG. 3, in the first transmission control switch 110, the switch signal CS is received to determine whether to invert the input signal Vin1 of the input terminal into a first pending signal Va1 and transmit the first pending signal Va1 to the output terminal. In order to simplify the description, in the disclosure, the transmission direction of signals in which the input signal Vin1 is transmitted from the first chip CHIP1 to the second chip CHIP2 is named as a forward direction signal transmission; and the transmission direction of signals in which the input signal Vin2 is transmitted from the second chip CHIP2 to the first chip CHIP1 is named as a backward direction signal transmission. The first data path circuit 120 includes an input driving circuit 210, a short-circuit detection circuit 220, a leakage current cancellation circuit 230 and a bias circuit 260. During the forward direction signal transmission, the input driving circuit 210 may receive the first pending signal Va1 through the input terminal N11 and invert the first pending signal Va1 in to a second pending signal Va2 according to a first level voltage (e.g., power voltage VDD) and a second level voltage (e.g., ground voltage GND) while increasing the driving capability of the second pending signal Va2, and transmit the second pending signal Va2 to a corresponding terminal (a terminal A depicted in FIG. 3) of the TSV 130 located at the first chip CHIP1. The driving capability of second pending signal Va2 is increased to avoid data error due to fade-out of signals during the transmission and allow signals to be transmitted to an external circuit. In addition, a voltage level of the first level voltage (the power voltage VDD) is greater than a voltage level of the second level voltage (the ground voltage GND).

The short-circuit detection circuit 220 is connected to the corresponding terminal A of the TSV 130 located at the first chip CHIP1 to detect whether short-circuit on the TSV 130 and the silicon substrate 150 depicted in FIG. 2 is present according to the first pending signal Va1 and a level of the corresponding terminal A of the TSV 130, so as to generate a short-circuit detection output signal Sds. In the embodiment, the short-circuit detection circuit 220 is utilized to automatically detect whether short-circuit on the TSV 130 and the silicon substrate 150 is present, so as to determine whether to enable the short-circuit detection output signal Sds. During the forward direction signal transmission, if the TSV 130 is finely manufactured while short-circuit on the TSV 130 and the silicon substrate 150 is not present, the short-circuit detection output signal Sds may be disabled so the power voltage VDD may be constantly provided to the input driving circuit 210. However, if an insulating layer of the TSV 130 is broken or invaded by foreign impurity during manufacturing process, resulting short-circuit on the TSV 130 and the silicon substrate 150 is present in the first chip CHIP1 where the TSV 130 is located on, the short-circuit detection output signal Sds may be enabled so the leakage current cancellation circuit 230 may be informed to avoid leakage current to flow into the silicon substrate.

More specifically, the leakage current cancellation circuit 230 is connected to the short-circuit detection circuit 220 and the input driving circuit 210 and configured to avoid the leakage current generated by the first level voltage (the power voltage VDD) to flow into the silicon substrate 150 according to the short-circuit detection output signal Sds. In other words, when the short-circuit detection circuit 220 determines that the short-circuit detection output signal Sds is enabled due to short-circuit on the TSV 130 and the silicon substrate 150, the leakage current cancellation circuit 230 may turn off the power voltage VDD through a power control circuit 240, so as to avoid generating a leakage current I1 to flow into the input driving circuit 210. The leakage current cancellation circuit 230 may also quickly connect the corresponding terminal A of the TSV 130 to the ground voltage GND through the short-circuit protection circuit 250 and direct a leakage current I2 to the a ground terminal to avoid the leakage current 12 to flow into the silicon substrate, so as to prevent the voltage level in the silicon substrate 150 to shift. In addition, the bias circuit 260 is connected to the short-circuit detection circuit 220 and the leakage current cancellation circuit 230 to maintain a bias voltage of the short-circuit detection output signal Sds.

In the embodiment, the leakage current cancellation circuit 230 of FIG. 3 includes the power control circuit 240 and/or the short-circuit protection circuit 250, the two circuits may be implement together or only one at the time. Referring to FIG. 2 and FIG. 3 together, the power control circuit 240 of the first data path circuit (120 or 122) in FIG. 3 may be connected to the short-circuit detection circuit 220 to receive the short-circuit detection output signal Sds and determine whether to stop providing the first level voltage (the power voltage VDD) to the input driving circuit 210 according to the short-circuit detection output signal Sds. In other words, during the forward direction signal transmission and when short-circuit on the corresponding TSV 130 and the silicon substrate is determined by the short-circuit detection circuit 220, the power control circuit 240 stops providing the first level voltage (the power voltage VDD) to the input driving circuit 210 so the leakage current I1 generated by the power voltage VDD and the input driving circuit 210 during the signal transmission may also be stopped from being provided to the TSV 130.

The short-circuit protection circuit 250 is connected to the short-circuit detection circuit 220 and the corresponding terminal A of the TSV 130, which determines whether to turn on the corresponding terminal A of the TSV 130 to the ground voltage GND according to the short-circuit detection output signal Sds. In other words, during the forward direction signal transmission and when short-circuit on the TSV 130 and the silicon substrate is determined by the short-circuit detection circuit 220 (the short-circuit detection output signal Sds is enabled), the short-circuit protection circuit 250 may turn on the corresponding terminal A of the TSV 130 to the ground voltage GND so that the leakage current I2 generated by the power voltage VDD may be directed to the ground terminal through the short-circuit protection circuit 250, so as to avoid the leakage current I2 to flow into the silicon substrate 150 where the TSV 130 is located. During the backward direction signal transmission, the short-circuit detection circuit 220 may disable the short-circuit detection output signal Sds to avoid a situation in which the input signal Vin2 cannot be transmitted to the first chip CHIP1 through the TSV 130, and the short-circuit protection circuit 250 may turn off the corresponding terminal A of the TSV 130 to the ground voltage GND accordingly.

Figure 4:
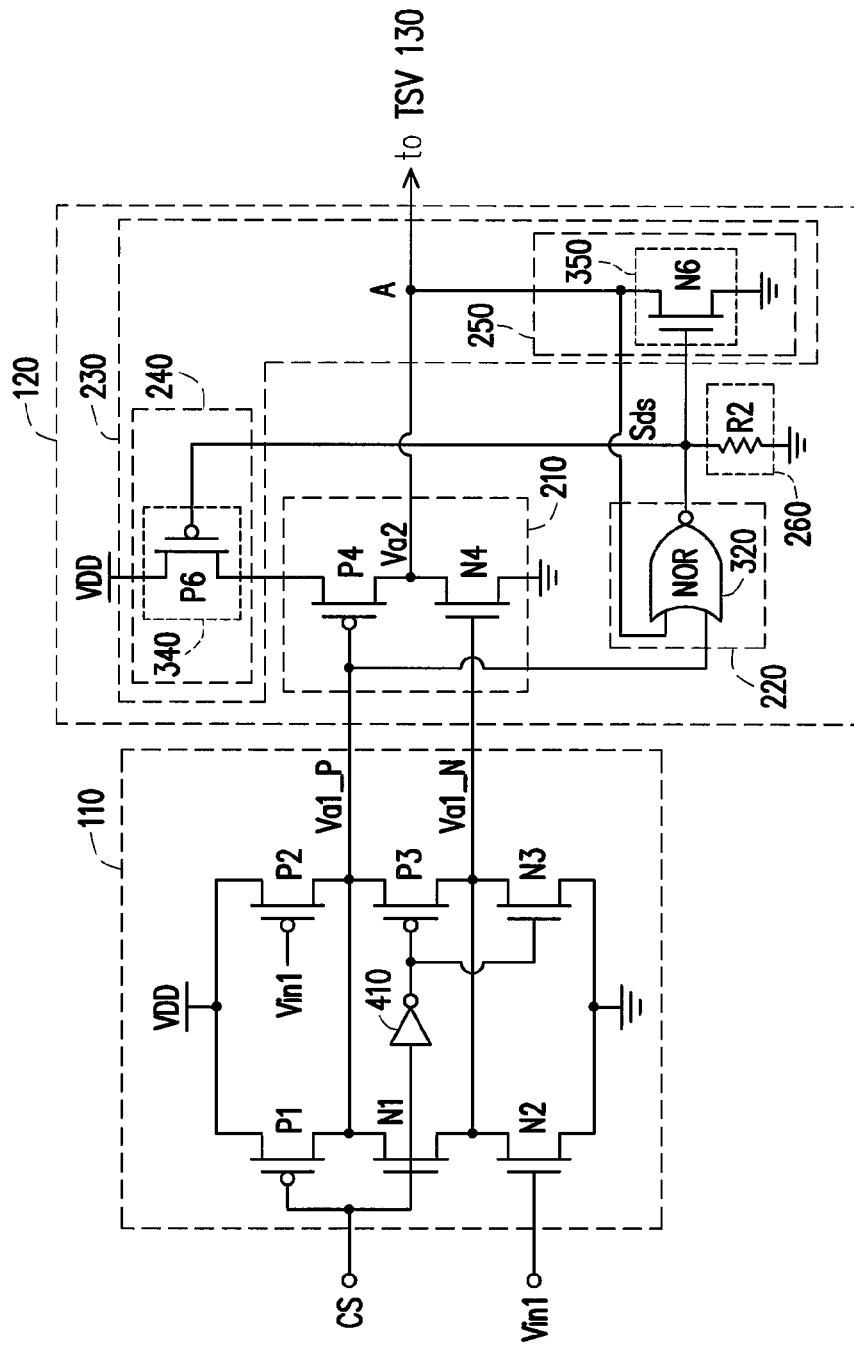
FIG. 4 is a circuit diagram illustrating the first transmission control switch and the first data path circuit depicted in FIG. 3.

FIG. 4 is a circuit diagram illustrating the first transmission control switch 110 and the first data path circuit 120 depicted in FIG. 3. In other words, FIG. 4 illustrates each circuit structure of elements in the first transmission control switch 110 and the first data path circuit 120 depicted in FIG. 3. In FIG. 4, the data path circuits 120, 122, 160 and 162 all have a similar circuit structure, thus the inner devices of the first transmission control switch 110 and the first data path circuit 120 are described hereinafter as an example. Referring to FIG. 4, in the embodiment, the first switch 110 includes a inverter 410, three P-type transistors P1 to P3 and three N-type transistors N1 to N3. The P-type transistor P1 has a control terminal (gate terminal) to receive the switch signal CS or the opposite switch signal CSB, and a first terminal (source terminal) to receive the power voltage VDD (the first level voltage). A second terminal (drain terminal) of the transistor P1 is connected to a first terminal (drain terminal) of the N-type transistor N1. The N-type transistor N1 has a control terminal (gate terminal) to receive the switch signal CS, and a second terminal (source terminal) of the N-type transistor N1 is connected to a first terminal (drain terminal) of the N-type transistor N2. The N-type transistor N2 has a control terminal (gate terminal) to receive the input signal Vin1 of the first chip CHIP1, and a second terminal to receive the ground voltage GND (the second level voltage).

The P-type transistor P2 has a control terminal (gate terminal) to receive the input signal Vin1 of the first chip CHIP1, and a first terminal (source terminal) to receive the power voltage VDD. The P-type transistor P2 has a second terminal (drain terminal) connected to a first terminal (source terminal) of the P-type transistor P3, a second terminal of the transistor P1 and a first terminal of the transistor N1, and configured as a first output terminal of the first transmission control switch 110 to generate a first pending signal Va1_P. An input terminal of the inverter 410 receives the switch signal CS. The P-type transistor P3 has a control terminal (gate terminal) connected to an output terminal of the inverter 410 to receive the opposite switch signal CSB, a second terminal (drain terminal) of the transistor P3 is connected to a first terminal (source terminal) of the N-type transistor N3, a second terminal of the transistor N1 and a first terminal of the transistor N2, and configured as a second output terminal of the first transmission control switch 110 to generate a first pending signal Va1_N. The N-type transistor N3 has a control terminal (gate terminal) connected to the output terminal of the inverter 410 to receive the opposite switch signal CSB and a second terminal (source terminal) to receive the ground voltage GND.

The input driving circuit 210 includes a N-type transistor N4 and a P-type transistor P4. The P-type transistor P4 has a control terminal (gate terminal) to receive the first pending signal Va1_P through the first output terminal of the first transmission control switch 110, whereas the N-type transistor N4 has a control terminal (gate terminal) to receive the first pending signal Va1_N through the second output terminal of the first transmission control switch 110. The P-type transistor P4 has a first terminal (source terminal) to receive the first level voltage (e.g., the power voltage VDD) from the power control circuit 240 and configured as a power terminal of the input driving circuit 210. The P-type transistor P1 has a second terminal (drain terminal) connected to a first terminal (drain terminal) of the N-type transistor N4 and configured as the output terminal of the input driving circuit 210 to generate the second pending signal Va2. The output terminal of the input driving circuit 210 is connected to the first terminal (the terminal A depicted in FIG. 3) of the TSV 130. A second terminal (source terminal) of the N-type transistor N4 receives the ground voltage GND. Therefore, the second pending signal Va2 is opposite to the first pending signal (Va1_P or Va1_N).

The short-circuit detection circuit 220 includes a NOR gate 320 (i.e., the first NOR gate) having a first input terminal connected to a first terminal (the terminal A) of the TSV 130, a second input terminal to receive the first pending signal Va1_P, and an output terminal to generate the short-circuit detection output signal Sds.

The bias circuit 260 has a first terminal connected to the output terminal of the short-circuit detection circuit 220 (i.e., the output terminal of the NOR gate 320) to maintain the bias voltage of the short-circuit detection output signal Sds. In the embodiment, the bias circuit 260 includes a bias resistor R2 having a first terminal connected to the output terminal of the short-circuit detection circuit 220 and a second terminal to receive the second level voltage (the ground voltage GND).

Figure 5A:
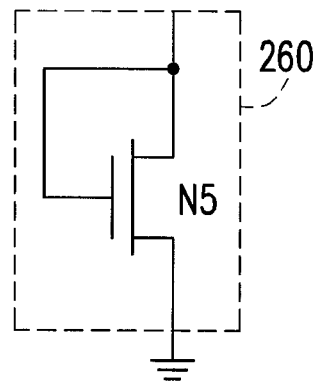
FIG. 5A and FIG. 5B are circuit diagrams illustrating the bias circuit depicted in FIG. 4 according to other embodiments.
Figure 5B:
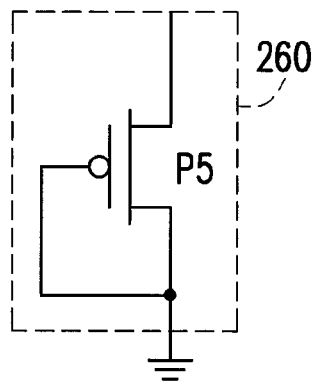

In this embodiment, the bias circuit 260 may also be disposed by utilizing a P-type metal oxide semiconductor field effect transistor and N-type metal oxide semiconductor field effect transistor, or the bias circuit 260 may not be disposed at all. FIG. 5A and FIG. 5B are circuit diagrams illustrating the bias circuit 260 depicted in FIG. 4 according to other embodiments. The bias circuit 260 of FIG. 5A includes a N-type transistor N5 having a drain terminal and a gate terminal which are connected to the output terminal of the short-circuit detection circuit 220 depicted in FIG. 4, and a source terminal to receive the ground voltage GND, so that the bias circuit 260 may have a sufficient bias resistance. The bias circuit 260 of FIG. 5B includes a P-type transistor P5 having a source terminal connected to the output terminal of the short-circuit detection circuit 220 depicted in FIG. 4 and a drain terminal and a gate terminal to receive the ground voltage GND, so that the bias circuit 260 may have a sufficient bias resistance.

Referring back to FIG. 4, the power control circuit 240 of the embodiment includes a first switch 340. The first switch 340 of the embodiment is implemented by using a P-type transistor P6, but the disclosure is not limited thereto. The P-type transistor P6 has a source terminal to receive the power voltage VDD, a drain terminal connected to the power terminal of the input driving circuit 210 and a gate terminal to receive the short-circuit detection output signal Sds.

The short-circuit protection circuit 250 includes a second switch 350, which is implemented by using a N-type transistor N6 in the embodiment. The N-type transistor N6 has a drain terminal connected to the first terminal (the terminal A) of the TSV 130, a source terminal connected to the ground voltage GND and a gate terminal to receive the short-circuit detection output signal Sds. The second switch 350 determines whether to turn on the corresponding terminal A of the TSV 130 to the ground voltage GND.

In view of above, operating steps for the circuit structures in the first data path circuit 120 depicted in FIG. 4 of the disclosure may be described with a truth table as Table (1) below:

TABLE (1)

| Status | CS | CSB | TSV 130 | Vin1 | Va1_P, Va1_N | Sds | Va2 | N6 | P6 |
|---|---|---|---|---|---|---|---|---|---|
| 1 | 0 | 1 | — | — | 1, 0 | 0 | — | turned off | turned on |
| 2 | 1 | 0 | normal | 0 | 1, 1 | 0 | 0 | turned off | turned on |
| 3 | 1 | 0 | normal | 1 | 0, 0 | 0 | 1 | turned off | turned on |
| 4 | 1 | 0 | short-circuit | 0 | 1, 1 | 0 | 0 (short-circuit) | turned off | turned on |
| 5 | 1 | 0 | short-circuit | 1 | 0, 0 | 1 | 0 (short-circuit) | turned on | turned off |

Referring to FIG. 2, FIG. 4 and Table (1) together. Status 1 indicates that the first transmission control switch is disabled, the input signal Vin1 cannot be transmitted, the second transmission control switch is enabled, the input signal Vin2 is transmitted from the second chip CHIP2 to the first chip CHIP1 (the backward direction signal transmission), the switch signal CS is logical "0", and the opposite switch signal CSB is logical "1". In this case, based on the switch signal CS being logical "0", the transistors P1 and N3 depicted in FIG. 4 are turned on, the transistor N1 and P3 are turned off so the first pending signal Va1_P and the power voltage VDD are maintained at the same level, such that the transistor P4 of the input driving circuit 210 are turned off accordingly; the first pending signal Va1_N and the ground voltage GND are maintained at the same level, the transistor N4 of the input driving circuit 210 are turned off, so as to disable the input driving circuit 210 from transmitting data.

Since the first pending signal Va1_P is logical "1", the NOR gate 320 of short-circuit protection circuit 220 changes the short-circuit detection output signal Sds to logical "0", thus the N-type transistor N6 of the second switch may be turned off to avoid the terminal A of the TSV 130 to be turned on to the ground voltage. Although the P-type transistor P6 of the first switch 340 of the power control circuit 240 may be turned on accordingly, the transistor P6 is turned off to avoid the power voltage VDD to be transmitted to the TSV 130.

Statuses 2 to 5 indicate that the input signal Vin1 is transmitted from the first chip CHIP1 to the second chip CHIP2 (the forward direction signal transmission), the switch signal CS is logical "1", and the opposite switch signal CSB is logical "0". In this case, since the switch signal CS being logical "1", the transistors P1 and N3 are turned off and the transistors N1 and P3 are turned on, so that the input signal Vin1 may be transmitted to the input driving circuit 210 accordingly. In which, statuses 2 to 3 indicate that the TSV 130 is in a normal condition, which means that short-circuit on the TSV 130 and the silicon substrate is not present; and statuses 4 to 5 indicate that the TSV 130 is in a short-circuit condition, which means that short-circuit on the TSV 130 and the silicon substrate is present.

In status 2, the input signal Vin1 is logical "0", so that transistor N2 is turned off and the transistor P2 is turned on, thus the first pending signals Va1_P and Va1_N both becomes logical "1" accordingly, the transistor N4 is turned on and the transistor P4 is turned off, so that the second pending signal Va2 becomes logical "0", which is opposite to the first pending signal (Va1_P or Va1_N). The short-circuit detection output signal Sds generated by the NOR gate 320 of the short-circuit detection circuit 220 is logical "0", so that the N-type transistor N6 of the second switch 350 is turned off accordingly. The P-type transistor P6 of the power control circuit 240 is turned on according to the short-circuit detection output signal Sds to constantly provide the power voltage VDD to the input driving circuit 210.

In status 3, the input signal Vin1 is logical "1", so that the transistor N2 is turned on and the transistor P2 is turned off, so that the first pending signals Va1_P and Va1_N become logical "0", the transistor N4 is turned off and the transistor P4 is turned on, thus the second pending signal Va2 becomes logical "1", which is opposite to the first pending signal (Va1_P or Va1_N). The short-circuit detection output signal Sds generated by the NOR gate 320 of the short-circuit detection circuit 220 is logical "0", so that the N-type transistor N6 of the second switch 350 is turned off accordingly. Accordingly, the P-type transistor P6 of the power control circuit 240 is turned on. Therefore, the second pending signal Va2 may be transmitted normally to the first output logical circuit 140 depicted in FIG. 2 through the TSV 130 and used as the first transmission signal st11.

Statuses 4 to 5 indicate that the TSV 130 is in the short-circuit condition, which means short-circuit o the TSV 130 and the silicon substrate is present. In status 4, the input signal Vin1 is logical "0" and since the second pending signal Va2 originally being logical "0" is still logical "0" after passing through short-circuit on TSV 130, thus it is the same as in status 2, in which the transistor N6 is turned off and the transistor P6 is turned on.

In status 5, although the input signal Vin1 is logical "1", the second pending signal Vat originally being logical "1" changes to logical "0" due to short-circuit on the TSV 130. Therefore, the short-circuit detection output signal Sds generated by the NOR gate 320 of the short-circuit detection circuit 220 becomes logical "1" so the N-type transistor N6 of the second switch 350 is turned on accordingly, which allows the leakage current to be directed to the ground voltage through the terminal A of the TSV 130; and the P-type transistor P6 of the first switch 340 is turned off accordingly.

However, since the first transmission signal st11 transmitted to the first output logical circuit 140 through the TSV 130 becomes logical "0", the first transmission signal st11 may not be correctly transmitted to the first output logical circuit 140. Despite that the first data path circuit 120 of FIG. 4 may not perform a correct data self-repair operation for status 5 as shown in Table (1), above problems may be solved by using two or more of the transmission path modules TPM1 and TPM2 depicted in FIG. 2.

Figure 6A:
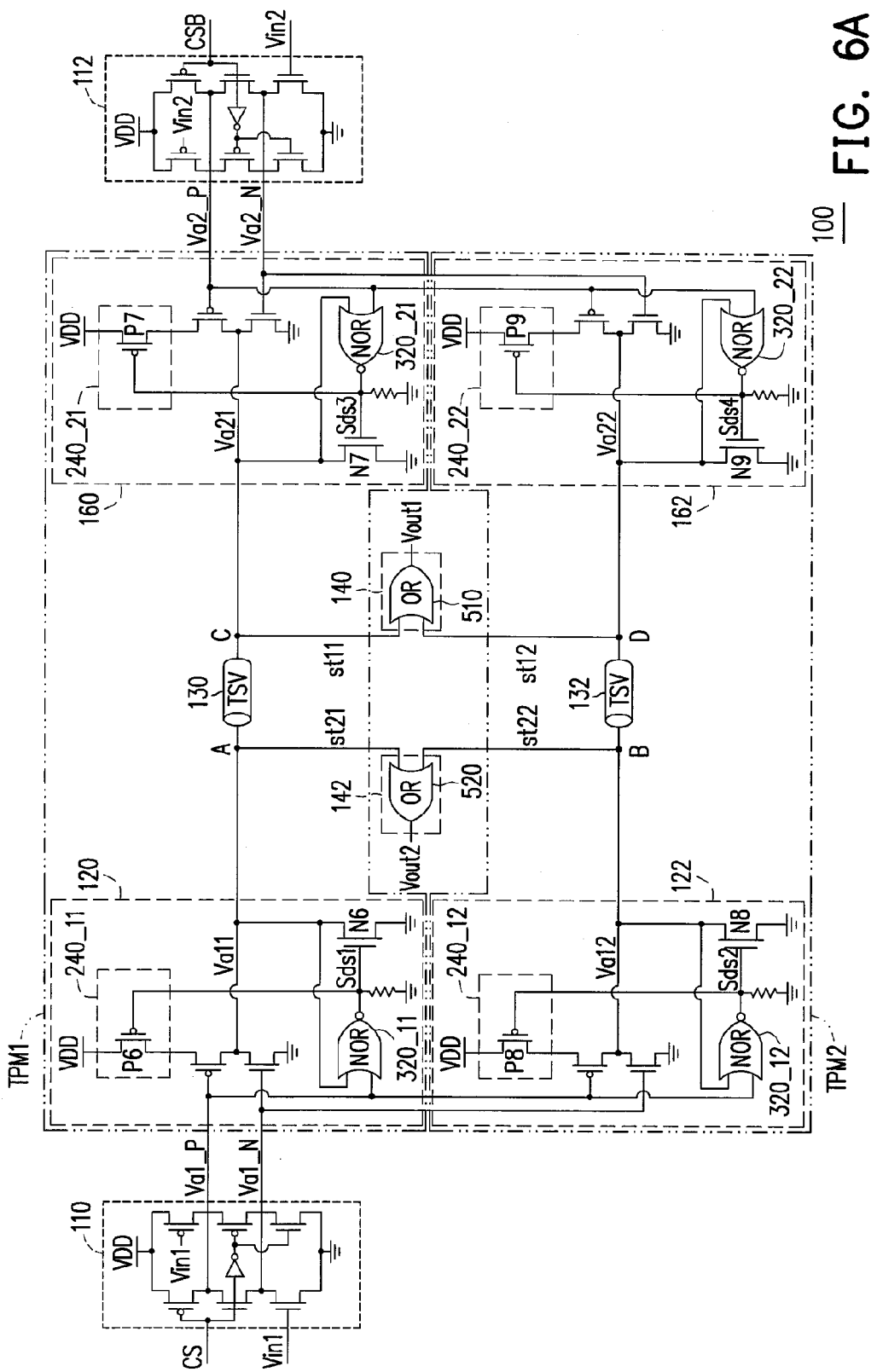
FIG. 6A is a circuit diagram illustrating the TSV repair circuit according to the first embodiment of the disclosure.

FIG. 6A is a circuit diagram illustrating a TSV repair circuit 100 according to the first embodiment of the disclosure. In other words, FIG. 6A illustrates circuit structures of all devices in FIG. 2. Since the first data path circuits 120 and 122 illustrated in FIG. 6A are identical to the first data path circuit 120 illustrated in FIG. 3, thus the operating mechanism thereof is omitted herein. In FIG. 6A, a difference between the second data path circuits 160 and 162 and the first data path circuits 120 and 122 lies where: Two input terminals of the second data path circuit (160 or 162) respectively receive the first pending signal (Va2_P or Va2_N) of the second transmission control switch 112 instead of the first pending signal (Va1_P or Va1_N). The second transmission control switch 112 receives the opposite switch signal CSB and the input signal Vin2 of the second chip CHIP2 instead of the switch signal CS and the input signal Vin1 of the first chip CHIP1.

FIG. 6A is provided with two transmission path modules TPM1 and TPM2 thus the first output logical circuit 140 includes a OR gate 510 (i.e., the first OR gate) having two input terminals, whereas the second output logical circuit 142 includes a OR gate 520 (i.e., the second OR gate) having two input terminals. During the forward direction signal transmission, a first input terminal and a second input terminal of the OR gate 510 may respectively receive the first transmission signal (st11 or st12) from the first data path circuit (120 or 122) through the second terminal (C or D) of the TSV (130 or 132). With signal processing mechanism of the OR gate 510, the first output signal Vout1 may be correctly self-repaired, so that the input signal Vin1 may be transmitted from the first chip CHIP1 to the second chip CHIP2. The second output logical circuit 142 includes the OR gate 520 (i.e., the second OR gate). During the backward direction signal transmission, a first input terminal and a second terminal of the OR gate 520 may respectively receive the first transmission signal (st21 or st22) respectively from the first data path circuit (160 or 162) through second terminals (A or B) of the TSV (130 or 132). With signal processing mechanism of the OR gate 520, the second output signal Vout2 may be correctly self-repaired, so that the input signal Vin2 may be transmitted from the second chip CHIP2 to the first chip CHIP1.

Operating steps for the circuit structures in the TSV repair circuit 100 depicted in FIG. 6A of the disclosure may be described with a truth table as Table (2) below: The transmission direction of signal herein is set to transmit from the first chip CHIP1 to the second chip CHIP2 (i.e., the forward direction signal transmission), so that the switch signal CS is logical "1" and the opposite switch signal CSB is logical "0".

TABLE (2)

| Status | TSV 130 | TSV 132 | Vin1 | Va11 (A) | Va12 (B) | Vout1 | N6 | P6 | N8 | P8 |
|---|---|---|---|---|---|---|---|---|---|---|
| 1 | normal | normal | 0 | 0 | 0 | 0 | turned off | turned on | turned off | turned on |
| 2 | normal | normal | 1 | 1 | 1 | 1 | turned off | turned on | turned off | turned on |

TABLE (2)-continued

| Status | TSV 130 | TSV 132 | Vin1 | Va11 (A) | Va12 (B) | Vout1 | N6 | P6 | N8 | P8 |
|---|---|---|---|---|---|---|---|---|---|---|
| 3 | short-circuit | normal | 0 | 0 (short-circuit) | 0 | 0 | turned off | turned on | turned off | turned on |
| 4 | short-circuit | normal | 1 | 0 (short-circuit) | 1 | 1 | turned on | turned off | turned off | turned on |
| 5 | normal | short-circuit | 0 | 0 | 0 (short-circuit) | 0 | turned off | turned on | turned off | turned on |
| 6 | normal | short-circuit | 1 | 1 | 0 (short-circuit) | 1 | turned off | turned on | turned on | turned off |
| 7 | short-circuit | short-circuit | 0 | 0 (short-circuit) | 0 (short-circuit) | 0 | turned off | turned on | turned off | turned on |
| 8 | short-circuit | short-circuit | 1 | 0 (short-circuit) | 0 (short-circuit) | 0 | turned on | turned off | turned on | turned off |

Based on the switch signal CSB being logical "0", the second transmission control switch 112 is disabled and the first pending signal Va2_P is connected to the power voltage VDD so that the short-circuit detection output signal (Sds3 or Sds4) of the second data path circuit (160 or 162) becomes "0", the N-type transistor (N7 or N9) is turned off accordingly, so as to avoid the terminal (C or D) of the TSV (130 or 132) to be turned on to ground voltage.

Referring to FIG. 6A and Table (2) together, statuses 1 and 2 indicate that the TSVs 130 and 132 are both in the normal condition. It should be noted that, the pending signal Va11 located at the terminal A of the TSV 130 and the first transmission signal st11 located at the terminal C are of the same level. The pending signal Va12 located at the terminal B of the TSV 132 and the first transmission signal st12 located at the terminal D are also of the same level.

According to status 1 in Table (2), the input signal Vin1 is logical "0", after signals being processed by the first transmission control switch 110 and the first data path circuits (120 or 122), the pending signals Va11 and Va12 are theoretically equivalent to the input signal Vin1 being logical "0". The short-circuit detection output signals Sds1 and Sds2 generated by the NOR gates 320_11 and 320_12 are both logical "0". The transistors P6 and P8 are respectively turned on to constantly provide the power voltage VDD, and the transistors N6 and N8 are turned off. Since the first transmission signals st11 and st12 are logical "0", the OR gate 510 of the first output logical circuit 140 changes the first output signal Vout1 to logical "0".

According to status 2 in Table (2), the input signal Vin1 is logical "1" and the pending signals Va11 and Va12 are both logical "1". The short-circuit detection output signals Sds1 and Sds2 are both logical "0". The transistors P6 and P8 are respectively turned on to constantly provide the power voltage VDD, and the transistors N6 and N8 are turned off. Since the first transmission signals st11 and st12 are logical "1", the OR gate 510 of the first output logical circuit 140 changes the first output signal Vout1 to logical "1".

Statuses 3 to 4 indicate that the TSV 130 is in the short-circuit condition with the silicon substrate and the TSV 132 is in the normal condition. In status 3, the input signal Vin1 is logical "0", the pending signal Va11 is logical "0" regardless of whether it is in the short-circuit condition, and the pending signal Va2 is logical "0". In this case, operations on the transistors P6, N6, P8 and N8 are identical to that in status 1, so description thereof is omitted herein. In status 4, the input signal Vin1 is logical "1", the pending signal Va11 is originally logical "1" but being lower to logical "0" due to short-circuit on the TSV 130, and the pending signal Va12 is logical "1". In this case, based on the first pending signal Va1_P being logical "0" and the second pending signal Va11 being logical "0", the short-circuit detection output signal Sds1 is logical "1" and the short-circuit detection output signal Sds2 is logical "0". The transistor N6 is turned on so the first terminal A of the TSV 130 is turned on to ground voltage, so as to direct the leakage current to the ground terminal. The transistor P6 is turned off to stop providing the power voltage VDD so the first pending signal (Va1_P or Va1_N) may not be transmitted by the first data path circuit 120. The transistor P8 is turned on to constantly provide the power voltage VDD and the transistor N8 is turned off. Since the first transmission signals st11 and st12 are respectively being logical "0" and logical "1", signal processing mechanism of the OR gate 510 may be used to automatically repair the first output signal Vout1 to logical "1" (which is identical to the input signal Vin1).

Statuses 5 to 6 indicate that the TSV 130 is in the normal condition and the TSV 132 is in the short-circuit condition with the silicon substrate. In status 5, the input signal Vin1 is logical "0", the pending signal Va11 is logical "0", and the pending signal Va12 is logical "0" regardless of whether it is in the short-circuit condition. In this case, operations on the transistors P6, N6, P8 and N8 are identical to that in status 1, so description thereof is omitted herein. In status 6, the input signal Vin1 is logical "1", the pending signal Va11 is logical "1", and the pending signal Va12 is logical "0" due to short-circuit on the TSV 132. In this case, the short-circuit detection output signal Sds1 is logical "0", the short-circuit detection output signal Sds2 is logical "1" based on the first pending signal Va1_P being logical "0" and the pending signal Va12 being logical "1". Accordingly, the transistor P6 is turned on to constantly provide the power voltage VDD while the transistor N6 is turned off. The transistor N8 is turned on so the first terminal B of the TSV 132 is turned on to ground voltage, so as to direct the leakage current to the ground terminal. The transistor P8 is turned off to stop providing the power voltage VDD so the first pending signal (Va1_P or Va1_N) may not be transmitted by the first data path circuit 122. Since the first transmission signals st11 and st12 are respectively being logical "1" and logical "0", signal processing mechanism of the OR gate 510 of the first output logical circuit 140 may be used to automatically repair the first output signal Vout1 to logical "1" (which is identical to the input signal Vin1).

Statuses 7 to 8 indicate that the TSVs 130 and 132 are both in the short-circuit condition with the silicon substrate. In status 7, the input signal Vin1 is logical "0", the pending signal Va11 and Va12 are both logical "0" (which is in the same phase as the input signal Vin1) regardless of whether they are in the short-circuit condition. Therefore, actuation of the TSV repair circuit 100 is identical to that in statuses 1, 3 and 5, and the first output logical circuit 140 may generate the correct first output signal Vout1 (logical "0").

In status 8, since the input signal Vin1 is logical "1", the pending signals Va11 and Va12 and the second transmission signals st11 and st12 are all lower to logical "0" due to short-circuit instead of being logical "1". The short-circuit detection output signals Sds1 and Sds2 generated by the NOR gate 320_11 and 320_12 are both logical "1" so the transistors P6 and P8 are both turned off to stop providing the power voltage VDD, such that first pending signals Va1_P and Va1_N may not be transmitted by the first data path circuits 120 and 122. Accordingly, the transistors N6 and N8 are turned on to direct the leakage current (which is supposed to flow into the TSVs 130 and 132) to the ground terminal. Since the OR gate 510 of first output logical circuit 140 respectively receive two incorrect second transmission signals st11 and st12 (logical "0"), the OR gate 510 may not perform the self-repair operation thereby generating an incorrect first output signal Vout1 (logical "0").

It should be noted that, actuating mechanism of the TSV repair circuit 100 during the forward direction signal transmission is disclosed in FIG. 6A with reference to the truth Table (2), persons skilled in the art may easily derive that the switch signal CS being logical "0" and the opposite switch signal CSB being logical "1" during the backward direction signal transmission based on above disclosure, so related description to actuating mechanism of the TSV repair circuit 100 of FIG. 6A is omitted herein. For instance, based on the switch signal CS being logical "0", the first transmission control switch 110 may directly connect the first pending signal Va1_P to the power voltage VDD so the short-circuit detection output signal (Sds1 or Sds2) of the first data path circuit (120 or 122) becomes logical "0", such that the N-type transistors N6 and N8 are turned off accordingly to avoid the terminal (A or B) of the TSV (130 or 132) to be turned on to the ground voltage.

Figure 6B:
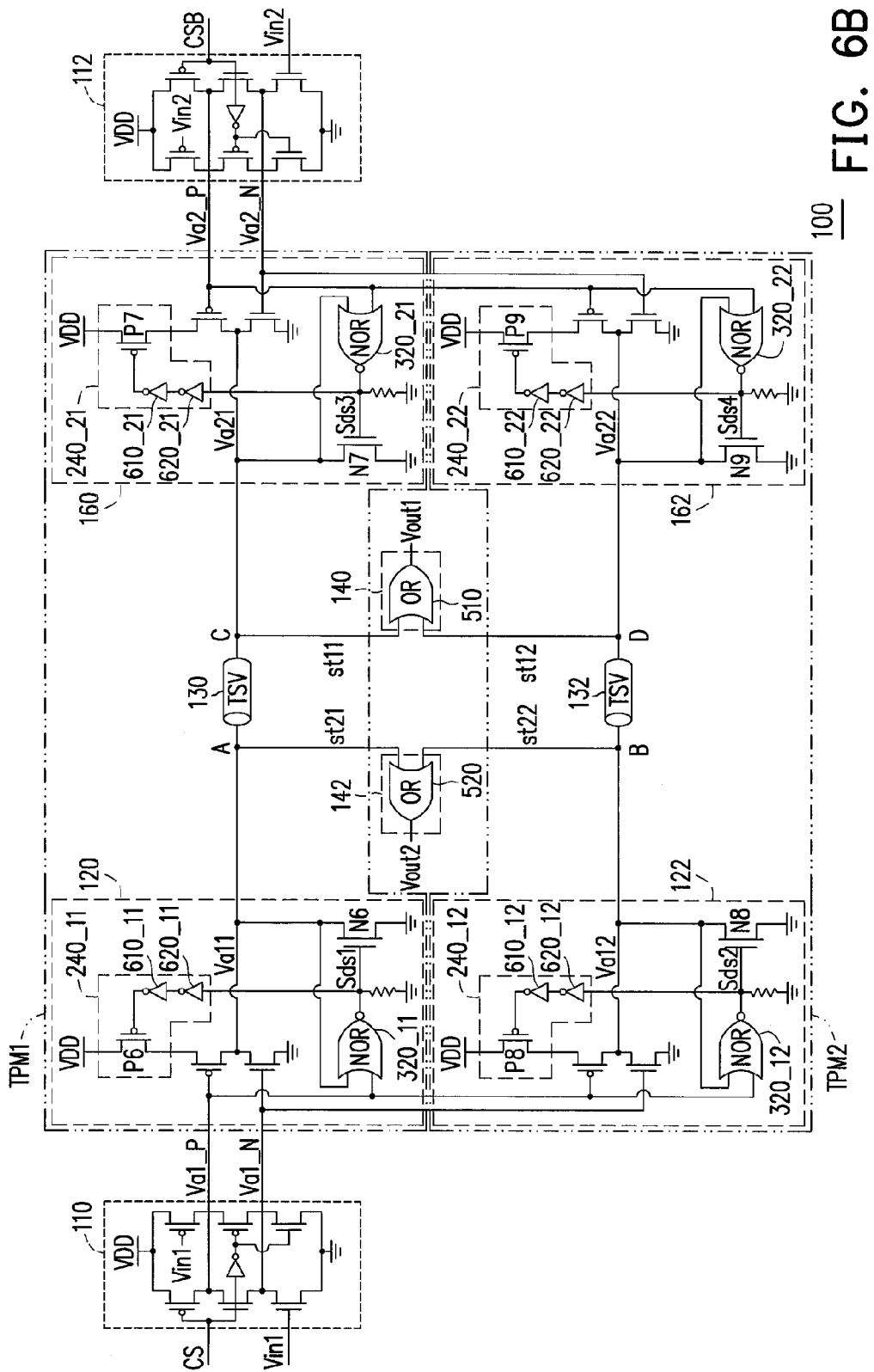
FIG. 6B is a circuit diagram illustrating the TSV repair circuit according to another example in the first embodiment of the disclosure.

FIG. 6B is a circuit diagram illustrating the TSV repair circuit 100 according to another example in the first embodiment of the disclosure. In which, accuracy in signal transmission of the short-circuit detection output signals Sds1 to Sds4 may be affected by the bias circuit 260, the short-circuit detection circuit 220 and the short-circuit protection circuit 250 depicted in FIG. 3. Therefore, in order to improve the control capabilities of the power control circuits 240_11, 240_12, 24021 and 240_22 in FIG. 6A, the TSV repair circuit 100 of FIG. 6B is configured to have each control terminal (i.e., the control terminals of the first switch) of the P-type transistors P6 to P9 included in the power control circuits 240_11, 240_12, 24021 and 24022 is disposed with two inverters (first inverters 610_11 to 610_22 and second inverters 620_11 to 620_22) connected to each other in series. That is, the gate terminals of the P-type transistor P6 to P9 respectively receive the short-circuit detection output signals Sds1 to Sds4 through the first inverters 610_11 to 610_12 and the second inverters 620_11 to 620_12, so as to improve accuracy in signal transmission of the short-circuit detection output signals Sds1 to Sds4.

Figure 7:
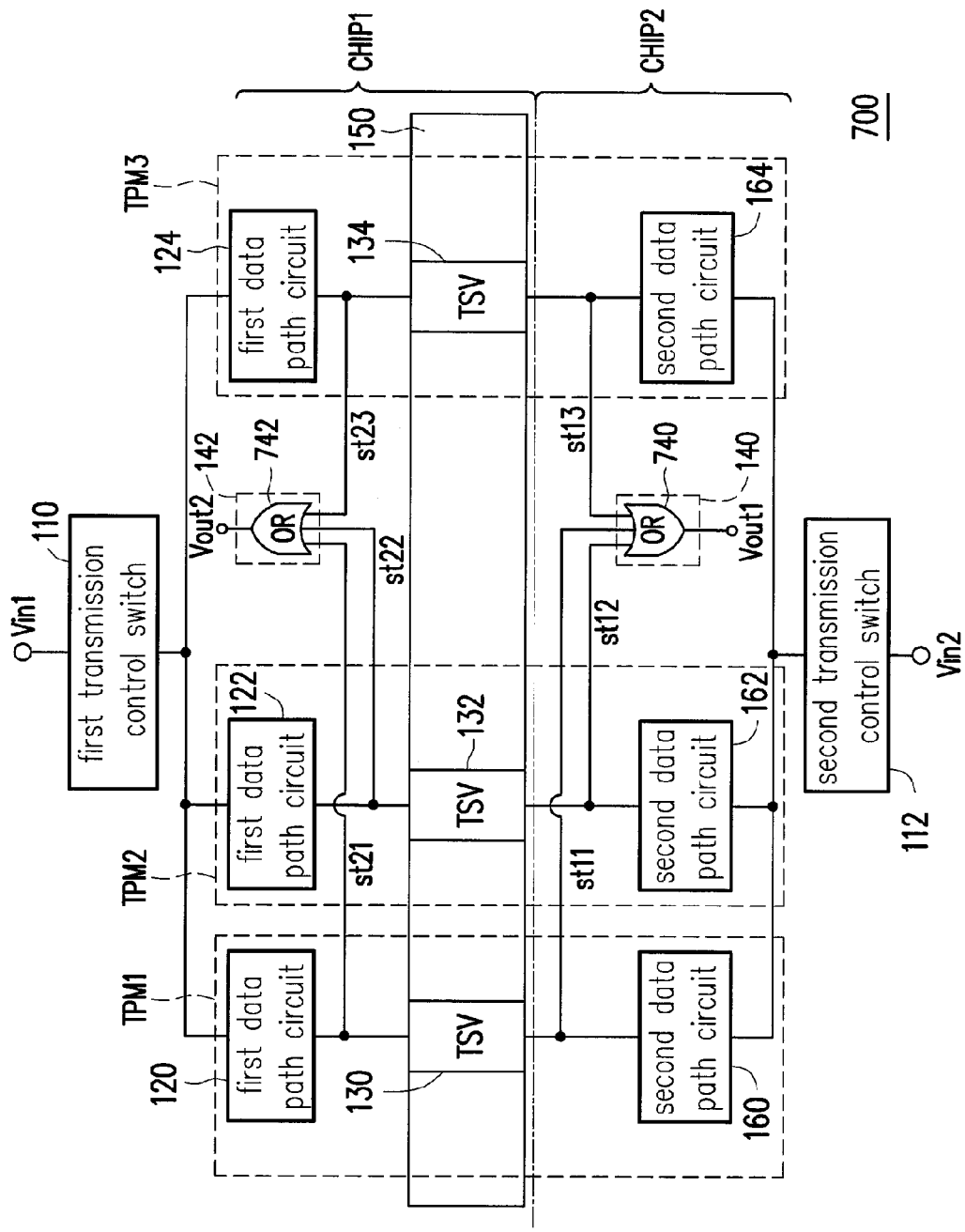
FIG. 7 is a circuit diagram illustrating a TSV repair circuit according to a second embodiment of the disclosure.

Despite that the TSV repair circuit 100 depicted in FIG. 6A may not perform a correct data self-repair operation for status 8 as shown in Table (2), above problems may be solved by using three or more of the transmission path module additionally, as shown in FIG. 7. FIG. 7 is a circuit diagram illustrating a TSV repair circuit 700 according to a second embodiment of the disclosure. The TSV repair circuit 700 of the embodiment is similar to the TSV repair circuit 100 of the first embodiment, the difference thereof lies where: The TSV repair circuit 700 is implemented by using three transmission path modules TPM1 to TPM3, which means that a third transmission path module TPM3 is additionally included besides the transmission path modules TPM1 and TPM2. A second terminal of a TSV 134 of the third transmission path module TPM3 transmits a first transmission signal st13 of the third transmission path module TPM3 to the first output logical circuit 140 through the first data path circuit 124, a first terminal of the TSV 134 of the third transmission path module TPM3 transmits a second transmission signal st23 of the third transmission path module TPM3 to the second output logical circuit 142 through the second data path circuit 164.

That is, the first output logical circuit 140 includes a OR gate 740 (i.e., the third OR gate) having a first input terminal, a second input terminal and a third input terminal respectively receive three first transmission signals st11, st12 and st13 through the second terminals of the TSVs 130, 132 and 134 located at the second chip CHIP2. An output terminal of the OR gate 740 generates the first output signal Vout1. That is, the second output logical circuit 142 includes a OR gate 742 (i.e., the fourth OR gate) having a first input terminal, a second input terminal and a third input terminal respectively receive three first transmission signals st21, st22 and st23 through the first terminals of the TSVs 130, 132 and 134 located at the first chip CHIP1. An output terminal of the OR gate 742 generates the second output signal Vout2. Operations and functions not being mentioned in the second embodiment may be referred to the same in the previous embodiment and therefore not repeated herein.

Figure 8:
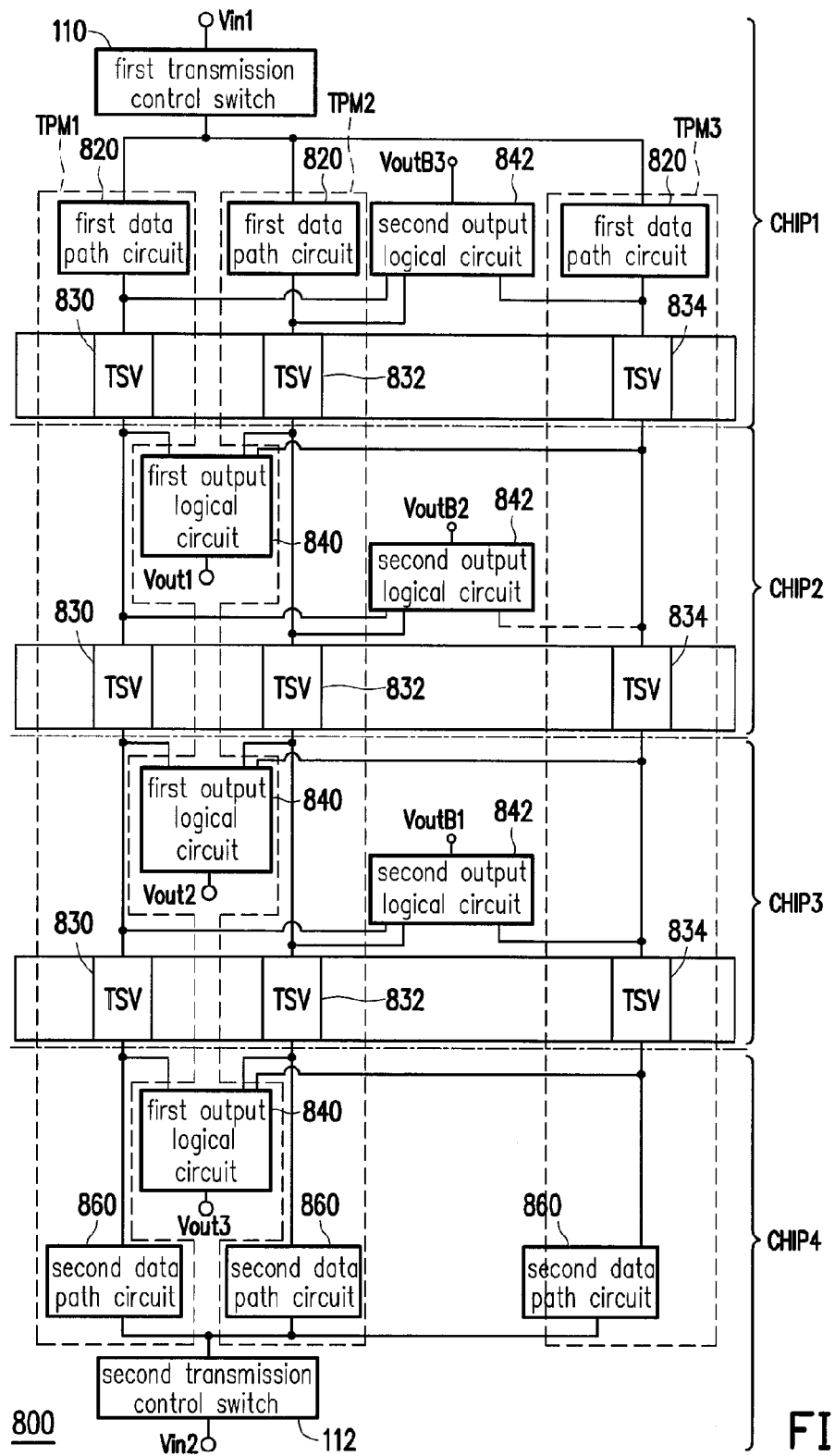
FIG. 8 is a schematic view illustrating a TSV repair circuit according to a third embodiment of the disclosure.

FIG. 8 is a schematic view illustrating a TSV repair circuit 800 according to a third embodiment of the disclosure. The TSV repair circuit 800 is flexible in adopting 3DIC technology, such that the TSV repair circuit 800 according to the spirit of the embodiment may also be used in stacked type chips. For instance, the transmission path modules TPM1 to TPM3 in the TSV repair circuit 800 are disposed in a plurality of stacked type chips (e.g., the chips CHIP1 to CHIP4 as illustrated in FIG. 8), the signal may be transmitted from the first chip CHIP1 to the fourth chip CHIP4 through the chips CHIP2 and CHIP3 (the forward signal transmission), or from the fourth chip CHIP4 to the first chip CHIP1 through the chips CHIP2 and CHIP3 (the backward signal transmission). The transmission path modules TPM1 to TPM3 respectively include TSVs 830, 832 and 834 (which passing through different chips) in between the first chip CHIP1 and the fourth chip CHIP4.

The first output logical circuit 840 may be disposed on chips other than the first chip CHIP1 (e.g., the second chip CHIP2 to the fourth chip CHIP4) and having three input terminals respectively connected to terminals of the chips where the TSVs 830, 832 and 834 are located, so as to respectively receive a plurality of transmission signals. Accordingly, during the forward signal transmission, the first output logical circuit 840 located at different chips may generate output signals Vout1, Vout2 and Vout3 respectively at the second chip CHIP2 to the fourth chip CHIP4. The second output logical circuit 842 may be disposed on chips other than the fourth chip CHIP4 (e.g., the first chip CHIP1 to the third chip CHIP3) and having three input terminals respectively connected to terminals of the chips where the TSVs 830, 832 and 834 are located, so as to respectively receive a plurality of transmission signals. During the backward signal transmission, the second output logical circuit 842 located at different chips may generate output signals VoutB3, VoutB2 and VoutB1 respectively at the first chip CHIP1 to the third chip CHIP3. Accordingly, the TSV repair circuit 800 may bidirectionally and correctly transmit the input signals Vin1 or Vin2 of the first chip CHIP1 and the fourth chip CHIP4 to the corresponding chips based on adjustment of the switch signal CS and the opposite switch signal CSB.

Figure 9:
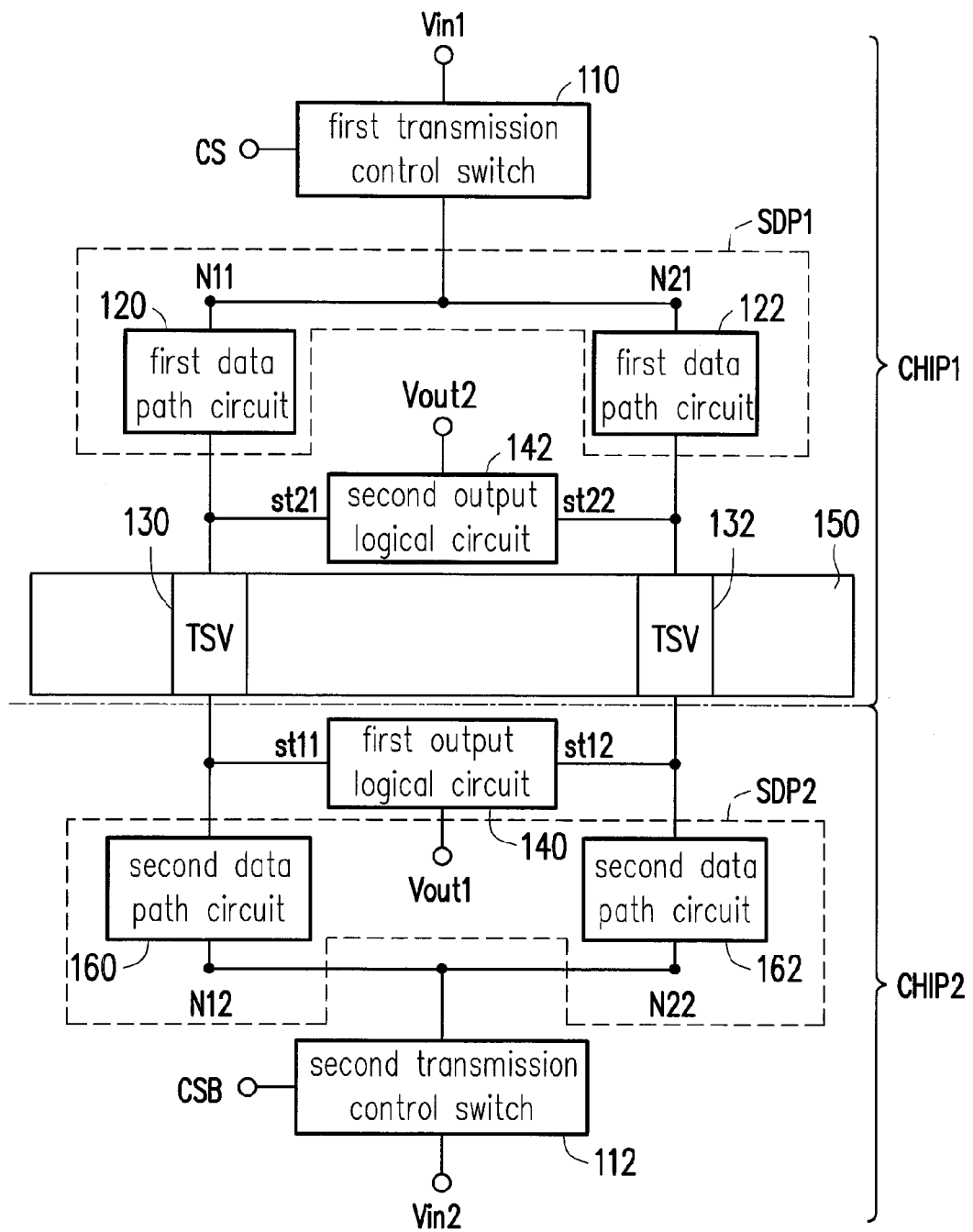
FIG. 9 is a schematic view illustrating a TSV repair circuit according to a fourth embodiment of the disclosure.

FIG. 9 is a schematic view illustrating a TSV repair circuit 900 according to a fourth embodiment of the disclosure. The TSV repair circuit 900 of FIG. 9 is similar to the TSV repair circuit 100 of FIG. 2, the difference thereof lies where: The TSV repair circuit 100 depicted in FIG. 2 mainly transmits data through the transmission path modules TPM1 (composed by the first data circuit 120, the TSV 130 and the second data path circuit 160) and TPM2 (composed by the first data circuit 122, the TSV 132 and the second data path circuit 162) and the output logical circuits 140 and 142, whereas the TSV repair circuit 900 depicted in FIG. 9 includes at least two data path modules SDP1 to SDP2 and at least two corresponding TSVs 130 and 132, and a plurality of output logical circuits 140 and 142. In other words, in the embodiment, two first data path circuits 120 and 122 are designed into the data path module SDP1 as the same module and two second data path circuits 160 and 162 are designed the data path module SDP2 as another module, so as to transmit signals together with the corresponding TSV (130 or 132). Nevertheless, the disclosure is not limited to above the embodiment.

Each of the data path modules SDP1 and SDP2 may include at least two data path circuits having a same input terminal, the input terminal of each of the data path modules SDP1 and SDP2 is connected to the output terminals of the first and the second transmission control switches 110 and 112 to receive the pending signals Vin1 or Vin2 respectively during the forward signal transmission or the backward signal transmission. For instance, in the data path module SDP1 composed by the first data path circuits 120 and 122, the two terminals N11 and N21 are connected to each other and to the output terminal of the first transmission control switch 110. In the data path module SDP2 composed by the second data path circuits 160 and 162, the two terminals N12 and N22 are connected to each other and to the output terminal of the second transmission control switch 112.

In each of the data path modules (e.g., the data path module SDP1), the output terminal of the data path circuit (e.g., the first data path circuits 120 or 122) is connected to the corresponding terminal of the TSV (130 or 132) leading to the next-stage chip (the second chip CHIP2) in the corresponding chip (the first chip CHIP1), so as to transmit data through the TSV (130 or 132). A plurality of output logical circuits (e.g., the output logical circuits 140 and 142) are respectively disposed on any one chip. The input terminal of the output logical circuits is connected to terminals at the same side of the TSV (130 or 132) in the any one chip to receive at least two transmission signals and respectively generate the output signal. For instance, the input terminal of the output logical circuit 140 is connected to the terminals of the TSV (130 or 132) at the same side in the second chip CHIP2 to receive the transmission signals st11 and st12 and generate output signal Vout1; The output logical circuit 142 is similar to the output logical circuit 140, thus related description is omitted herein. Detail description of the rest of devices may be referred to the description in the previous embodiments.

Figure 10:
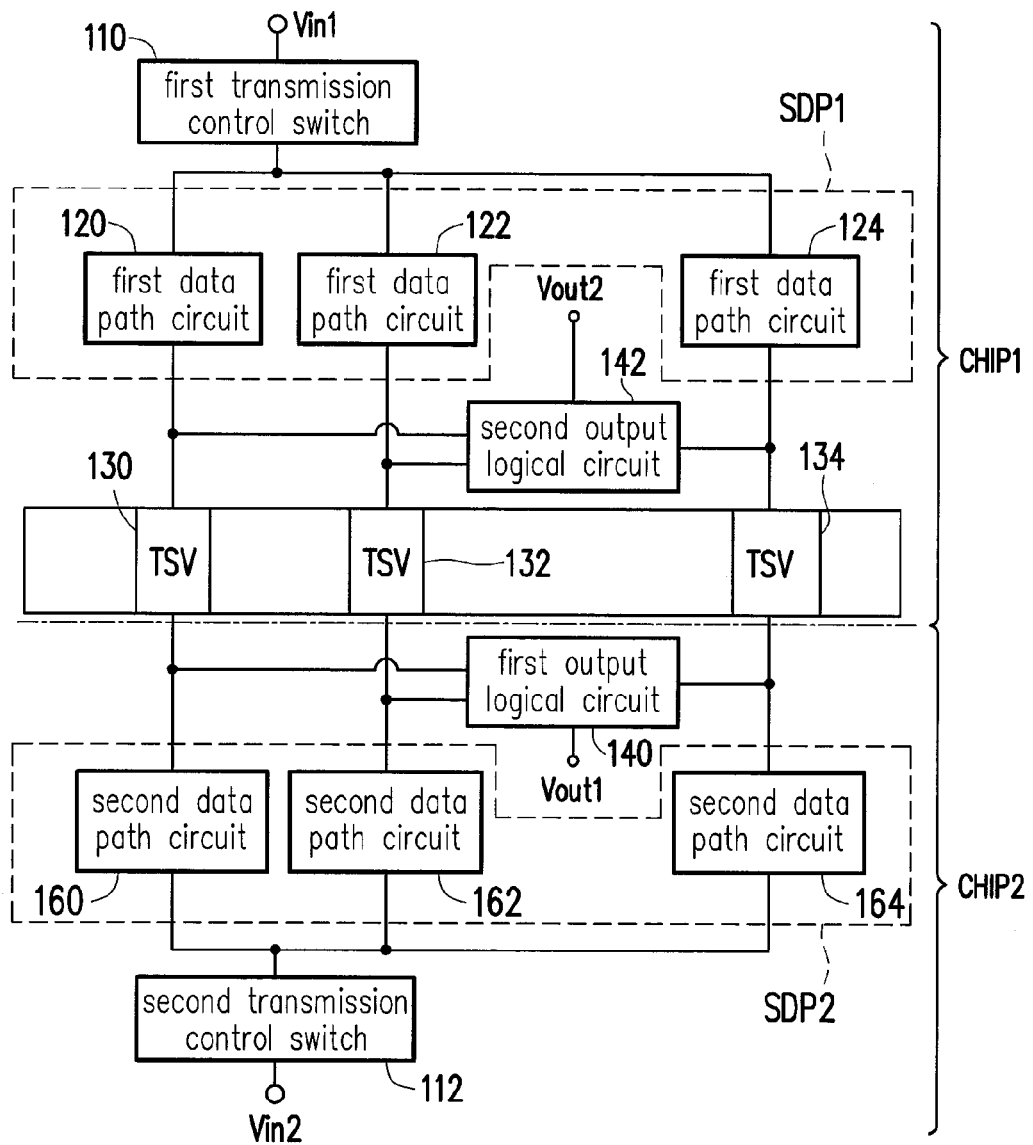
FIG. 10 is a schematic view illustrating a TSV repair circuit according to a fifth embodiment of the disclosure.

FIG. 10 is a schematic view illustrating a TSV repair circuit 1000 according to a fifth embodiment of the disclosure. The fifth embodiment is similar to the fourth embodiment as illustrated in FIG. 9, the difference thereof lies where: Each of the data path modules SDP1 to SDP2 depicted in FIG. 9 includes two data path circuits (e.g., the first data path circuits 120 and 122, and the second data path circuits 160 and 162) and having two corresponding TSVs 130 and 132; Each of the data path modules SDP1 to SDP2 in the fifth embodiment of the disclosure includes three or more data path circuits (e.g., the first data path circuits 120, 122 and 124 and the second data path circuits 160, 162 and 164) and having three corresponding TSVs 130, 132 and 134. Therefore, in the disclosure, a number of circuits and their corresponding number of TSVs in each of the data path modules may be adjusted based on the actual requirement. Detail description of the rest of devices may be referred to the description in the previous embodiments.

Figure 11:
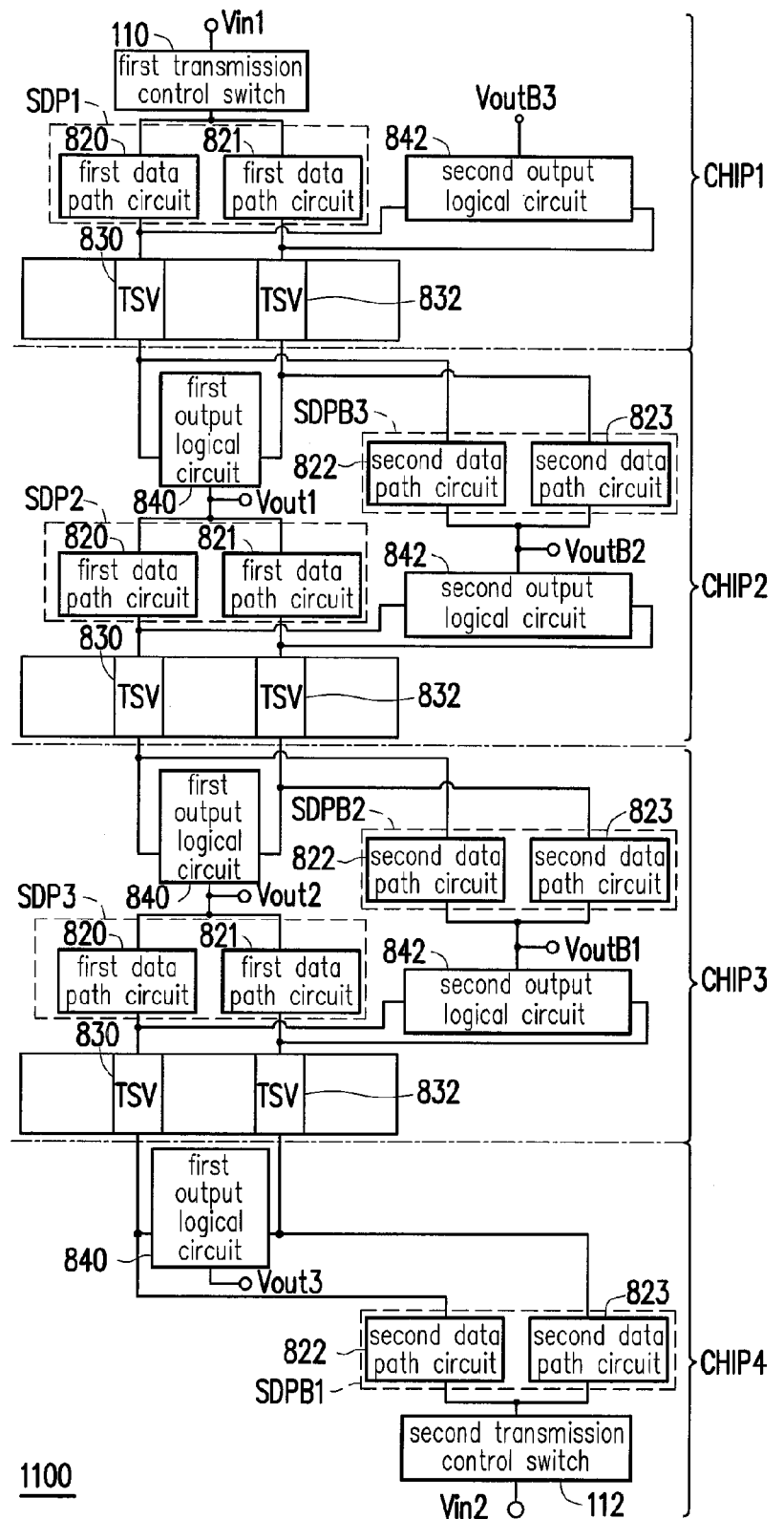
FIG. 11 is a schematic view illustrating a TSV repair circuit according to a sixth embodiment of the disclosure.

The implementation of the fourth to the fifth embodiments may also be used in multiple stacked chips as shown in FIG. 11. FIG. 11 is a schematic view illustrating a TSV repair circuit 1100 according to a sixth embodiment of the disclosure. The TSV repair circuit 1100 includes a plurality of chips (e.g., the first chip CHIP1 to the fourth chip CHIP4), the first transmission control switch 110 and the second transmission control switch 112, at least two TSVs 830 and 832, a plurality of data path modules SDP1 to SDP3 and SDPB1 to SDPB3 and a plurality of the output logical circuits 840 and 842. The chips CHIP1 to CHIP4, the first and the second transmission control switches 110 and 112 and the TSVs 830 and 832 are all identical to the same as in the previous embodiments. In addition, the data path circuits 820 to 821 in each of the data path modules SDP1 to SDP3 are all identical to the first data path circuits 120 and 120 depicted in FIG. 2 and the first data path circuit 820 depicted in FIG. 8, and the data path circuits 822 to 823 in each of the data path modules SDPB1 to SDPB3 are all identical to the second data path circuits 160 and 162 depicted in FIG. 2 and the second data path circuit 860 depicted in FIG. 8, so related descriptions to the above is omitted hereinafter.

The plurality of data path modules SDP1 to SDP3 and SDPB1 to SDPB3 are disposed on all chips. Each of the data path modules SDP1 to SDP3 and SDPB1 to SDPB3 includes at least two data path circuits having a same input terminal, person skilled in the art may adjust the number of the data path circuits in each of the of the data path modules SDP1 to SDP3 and SDPB1 to SDPB3 based on actual requirements. Each of the transmission path modules SDP1 to SDP3 and SDPB1 to SDPB3 in FIG. 11 includes two data path circuits. The input terminal of the data path module (e.g., the data path modules SDP1 or SDPB1) is connected to the output terminals of the first transmission control switch 110 and the second transmission control switch 112 to receive the input signals Vin1 or Vin2 respectively during forward signal transmission or the backward signal transmission.

The input terminal of the data path module (e.g., the data path modules SDP2 to SDP3 and SDPB2 to SDPB3) may also receive output signals from a previous-stage chip respectively, and the output terminal of the data path circuit in each of the data path modules is respectively connected to the corresponding terminal of the TSV (830 or 832) leading to the next-stage chip in the corresponding chip, so as to transmit data through the TSV (830 or 832). For instance, the input terminal of each of the data path modules SDP2 to SDP3 may also respectively receive the output signals Vout1 and Vout2 from the first output logical circuit 840 locate on the same chip, and the output terminal of each of the data path circuits 820 and 821 in the data path modules SDP2 to SDP3 is respectively connected to the terminal of the TSV (830 or 832) leading to the next-stage chip in the corresponding chip. Similarly, the input terminal of each of the data path modules SDPB2 to SDPB3 may respectively receive output signals VoutB1 and VoutB2 through the second output logical circuit 842 on the same chip, and the output terminal of each of the data path circuits 822 and 823 in the data path modules SDP2 to SDP3 is respectively connected to the terminal of the TSV (830 or 832) leading to the next-stage chip in the corresponding chip. The output logical circuits 840 and 842 are respectively disposed on the all chips. The input terminals of the output logical circuits 840 and 842 are connected to the terminals of the TSVs 830 and 832 at the same side in the all chips, so as to receive at least two transmission signals and respectively generate the output signals Vout1 to Vout3 and VoutB1 to VoutB3.

In other words, it is assumed that the input signal Vin1 is transmitted from the first chip CHIP1 to the fourth chip CHIP4 through the chips CHIP2 to CHIP3 (the forward signal transmission). In this case, the switch signal CS is logical "1", the input signal Vin1 may pass through the data path module SDP1 and the first output logical circuit 840 located at the second chip CHIP2, so as to self-repair and transmit the input signal Vin1 to the second chip CHIP2 to generate the output signal Vout1. Next, the input signal Vin1 may pass through the data path module SDP2 and the first output logical circuit 840 located at the third chip CHIP3 to self-repair and transmit the input signal Vin1 to the third chip CHIP3 to generate the output signal Vout2. Lastly, the input signal Vin1 may pass through the data path module SDP3 and the first output logical circuit 840 located at the fourth chip CHIP4 to self-repair and transmit the input signal Vin1 to the third chip CHIP4 to generate the output signal Vout3. In contrast, when the input signal Vin2 is transmitted from the fourth chip CHIP4 to the first chip CHIP1 through the chips CHIP3 to CHIP2 (the backward signal transmission). In this case, the switch signal CS is logical "0", the input signal Vin2 may pass through the data path module SDPB1 and the second output logical circuit 842 located at the third chip CHIP3, so as to self-repair and transmit the input signal Vin2 to the third chip CHIP3 to generate the output signal VoutB1. Accordingly, the input signal Vin2 may be self-repaired and sequentially transmitted to the second output logical circuit 842 of the second chip CHIP2 to generate the output signal VoutB2, and transmitted to the second output logical circuit 842 of the first chip CHIP1 to generate the output signal VoutB3. As a result, during the forward signal transmission, each time the input signal Vin1 is transmitted by the TSV repair circuit 1100 to pass one of the chips, the first output logical circuit 840 may be used to self-repair the input signal Vin1 into identical signals as the output signals Vout1 to Vout3; and during the backward signal transmission, each time the input signal Vin2 is transmitted by the TSV repair circuit 1100 to pass one of the chips, the second output logical circuit 842 may be used to self-repair the input signal Vin2 into identical signals as the output signals VoutB1 to VoutB3, thereby increasing stability of the data transmission.

In view of above, the TSV repair circuit of the embodiment is configured to use two transmission control switches and a switch signal to transmit data bidirectional in between a plurality of chips, and whether short-circuit on and a TSV and a silicon substrate is present may be determined according to an input signal, the switch signal and a level of the TSV. Once short-circuit on the TSV is present, the TSV repair circuit may turn off the power voltage and/or connect the TSV to the ground voltage, so as to avoid the leakage current to flow into the silicon substrate thereby preventing the voltage level in the silicon substrate to shift. Each of the output logical circuits may also self-repair the output signals into correct ones according to a plurality of transmission signals already transmitted, which allows the semiconductor apparatus (e.g., 3DIC) to transmit data correctly and bidirectional even if a partial of the TSVs is in a short-circuit condition. In addition, the first and the second transmission control switches of the disclosure may provide a sufficient driving capability to the input signal to be transmitted, such that the signal may be transmitted to an external circuit through bonding pads.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

What is claimed is:

1. A through silicon via (TSV) repair circuit, comprising:
a first chip and a second chip, wherein the first chip and the second chip are stacked on top of each other;
a first transmission control switch and a second transmission control switch respectively disposed on the first chip and the second chip, wherein the first transmission control switch and the second transmission control switch respectively receive a switch signal and an opposite switch signal as to determine whether to inverse an input signal of one of the first chip and the second chip into a first pending signal, transmit the first pending signal to an output terminal and turn off the input signal of another one of the first chip and the second chip;
at least two transmission path modules, wherein each of the transmission path modules has two terminals respectively connected to the output terminals of the first transmission control switch and the second transmission control switch, and each of the transmission path modules comprises at least one through silicon via (TSV); and
a first output logical circuit and a second output logical circuit respectively disposed on the second chip and the first chip, wherein at least two input terminals of the first output logical circuit and the second output logical circuit are respectively connected to a second terminal and a first terminal of at least one TSV to respectively receive at least two first transmission signals and at least two second transmission signals, and the output terminals of the first output logical circuit and the second output logical circuit respectively generate a first output signal and a second output signal,
wherein, each of the transmission path modules comprises:
the at least one TSV, wherein each of the at least one TSV passes through a silicon substrate to transmit signals between the first chip and the second chip to each other; and
a first data path circuit and a second data path circuit respectively disposed on the first chip and the second chip, wherein input terminals of the first data path circuit and the second data path circuit are respectively connected to the output terminals of the first transmission control switch and the second transmission control switch to receive the first pending signal, and output terminals of the first data path circuit and the second data path circuit are respectively connected to the first terminal and the second terminal of the at least one TSV to transmit data through the at least one TSV according to one of the switch signal and the opposite switch signal,
wherein, the first data path circuit and the second data path circuit respectively comprise:
an input driving circuit to receive the input signal, inverse the first pending signal into a second pending signal according to a first level voltage and a second level voltage, and transmit the second pending signal to a corresponding terminal of the at least one TSV;
a short-circuit detection circuit connected to a corresponding terminal of the at least one TSV to detect whether short-circuit on the at least one of TSV and a silicon substrate is present according to the first pending signal and a level of the corresponding terminal of the at least one TSV and generate a short-circuit detection output signal; and a leakage current cancellation circuit connected to the short-circuit detection circuit and the input driving circuit to avoid a leakage current generated by the first level voltage to flow into the silicon substrate according to the short-circuit detection output signal.

2. The TSV repair circuit of claim 1, wherein the first transmission control switch and the second transmission control switch respectively comprise:

a first P-type transistor having a control terminal to receive one of the switch signal and the opposite switch signal and a first terminal to receive the first level voltage;

a first N-type transistor having a control terminal to receive one of the switch signal and the opposite switch signal and a first terminal connected to a second terminal of the first P-type transistor;

a second N-type transistor having a control terminal to receive the input signal from one of the first chip and the second chip, a first terminal connected to a second terminal of the first N-type transistor and a second terminal to receive the second level voltage;

a second P-type transistor having a control terminal to receive the input signal from one of the first chip and the second chip, and a first terminal to receive the first level voltage;

an inverter having an input terminal to receive the switch signal;

a third P-type transistor having a control terminal connected to an output terminal of the inverter to receive one of the opposite switch signal and the switch signal, and a first terminal connected to a second terminal of the second P-type transistor, the second terminal of the first P-type transistor and the first terminal of the first N-type transistor and configured as a first output terminal of the first transmission control switch or the second transmission control switch to generate the first pending signal; and a third N-type transistor having a control terminal connected to the output terminal of the inverter to receive one of the opposite switch signal and the switch signal, a first terminal connected to a second terminal of the third P-type transistor, the second terminal of the first N-type transistor and the first terminal of the second N-type transistor and configured as a second output terminal of the first transmission control switch or the second transmission control switch to generate the first pending signal, and a second terminal to receive the second level voltage.

3. The TSV repair circuit of claim 2, wherein the input driving circuit comprises:

a fourth N-type transistor and a fourth P-type transistor, wherein control terminals of the fourth N-type transistor and the fourth P-type transistor are configured to receive the first pending signal respectively through the first output terminal and the second output terminal of the first transmission control switch or the second transmission control switch; a first terminal of the fourth P-type transistor is configured to receive the first level voltage; a second terminal of the fourth P-type transistor is connected to a first terminal of the fourth N-type transistor and configured as an output terminal of the input driving circuit to generate the second pending signal; and a second terminal of the fourth N-type transistor is configured to receive the second level voltage.

4. The TSV repair circuit of claim 1, wherein the at least two transmission path modules comprise a first transmission path module and a second transmission path module, wherein each of the first data path circuits in the first transmission path module and the second transmission path module respectively transmits the first transmission signal of the first transmission path module and the first transmission signal of the second transmission path module to the first output logical circuit through a corresponding one of the at least one TSV, and each of the second data path circuits in the first transmission path module and the second transmission path module respectively transmits the second transmission signal of the first transmission path module and the second transmission signal of the second transmission path module to the second output logical circuit through the corresponding one of the at least one TSV.

5. The TSV repair circuit of claim 4, wherein the first output logical circuit comprises:

a first OR gate having a first input terminal and a second input terminal to respectively receive two first transmission signals through the second terminal of the at least one TSV and an output terminal to generate the first output signal, and, the second output logical circuit comprises:

a second OR gate having a first input terminal and a second input terminal to respectively receive on of two second transmission signals through the first terminal of the at least one TSV and an output terminal to generate the second output signal.

6. The TSV repair circuit of claim 4, wherein the at least two transmission path modules further comprise a third transmission path module, wherein the first data path circuit in the third transmission path module transmits the first transmission signal of the third transmission path module to the first output logical circuit through the corresponding one of the at least one TSV, and the second data path circuit in the third transmission path module transmits the second transmission signal of the third transmission path module to the second output logical circuit through the corresponding one of the at least one TSV.

7. The TSV repair circuit of claim 6, wherein the first output logical circuit comprises:

a third OR gate having a first input terminal, a second input terminal and a third input terminal to respectively receive three first transmission signals through the second terminal of the at least one TSV, and an output terminal to generate the first output signal, and, the second output logical circuit comprises:

a fourth OR gate having a first input terminal, a second input terminal and a third input terminal to respectively receive three second transmission signals through the first terminal of the at least one TSV, and an output terminal to generate the second output signal.

8. The TSV repair circuit of claim 1, wherein the leakage current cancellation circuit comprises:

a power control circuit connected to the short-circuit detection circuit to determine whether to stop providing the first level voltage to the input driving circuit according to the short-circuit detection output signal.

9. The TSV repair circuit of claim 8, wherein the power control circuit comprises:

a first switch having a first terminal to receive the first level voltage, a second terminal connected to a power terminal of the input driving circuit, and a control terminal to receive the short-circuit detection output signal.

10. The TSV repair circuit of claim 9, wherein the power control circuit further comprises:
a first inverter and a second inverter, the control terminal of the first switch receives the short-circuit detection output signal through the first inverter and the second inverter.

11. The TSV repair circuit of claim 1, wherein the leakage current cancellation circuit comprises:
a short-circuit protection circuit connected to the short-circuit detection circuit and the at least one TSV to determine whether to turn on the corresponding terminal of the at least one TSV to the second level voltage according to the short-circuit detection output signal, wherein the first level voltage is greater than the second level voltage.

12. The TSV repair circuit of claim 11, wherein the short-circuit protection circuit comprises:
a second switch having a first terminal connected to the corresponding terminal of the at least one TSV, a second terminal connected to the second level voltage, and a control terminal to receive the short-circuit detection output signal.

13. The TSV repair circuit of claim 1, wherein the short-circuit detection circuit comprises:
a NOR gate having a first input terminal connected to the corresponding terminal of the at least one TSV, a second input terminal to receive the first pending signal, and an output terminal to generate the short-circuit detection output signal.

14. The TSV repair circuit of claim 1, wherein the first data path circuit and the second data path circuit respectively further comprise:
a bias circuit having a first terminal connected to an output terminal of the short-circuit detection circuit to maintain a bias voltage of the short-circuit detection output signal.

15. The TSV repair circuit of claim 14, wherein the bias circuit comprises:
a bias resistor having a first terminal connected to the output terminal of the short-circuit detection circuit, and a second terminal to receive the second level voltage.

16. The TSV repair circuit of claim 14, wherein the bias circuit comprises a fifth N-type transistor having a first terminal and a control terminal connected to the output terminal of the short-circuit detection circuit, and a second terminal to receive the second level voltage.

17. The TSV repair circuit of claim 14, wherein the bias circuit comprises a fifth P-type transistor having a first terminal connected to the output terminal of the short-circuit detection circuit, and a second terminal and a control terminal to receive the second level voltage.

18. The TSV repair circuit of claim 1, further comprising:
at least one chip stacked on top of each other with the first chip and the second chip, wherein the at least one TSV of each of the transmission path modules are respectively disposed on the at least one chip and turned on to each other.

19. A through silicon via (TSV) repair circuit, comprising:
a plurality of chips stacked on top of each other, and the plurality of chips comprise a first chip and a second chip;
a first transmission control switch and a second transmission control switch respectively disposed on the first chip and the second chip, wherein the first transmission control switch and the second transmission control switch respectively receive a switch signal and an opposite switch signal as to determine whether to inverse an input signal of one of the first chip and the second chip into a first pending signal, transmit the first pending signal to an output terminal and turn off the input signal of another one of the first chip and the second chip;
at least two TSVs respectively passed through a silicon substrate to transmit signals between the plurality of chips; and
at least two data path modules respectively disposed on the first chip and the second chip, wherein each of the data path modules comprises at least two data path circuits having a same input terminal, an output terminal of each of the data path module is connected to output terminals of the first transmission control switch and the second transmission control switch respectively to receive the first pending signal, and an output terminal of each the data path circuits in each the data path modules is connected to terminals of the at least two TSVs leading to a corresponding chip, so as to transmit data through the at least two TSVs according to one of the switch signal and the opposite switch signal; and
a plurality of output logical circuits respectively disposed on any one chip, wherein at least two input terminals in each of the output logical circuits are connected to terminals of the at least two TSVs at a same side in the any one chip, so as to receive at least two transmission signals to generate a corresponding output signal from an output terminal of each of the output logical circuits,
wherein each of the data path circuits comprises:
an input driving circuit to receive the input signal, inverse the first pending signal into a second pending signal according to a first level voltage and a second level voltage and transmit the second pending signal to corresponding terminals of the TSVs;
a short-circuit detection circuit connected to the corresponding terminals of the at least two TSVs to detect whether short-circuit on the corresponding one of the TSVs and a silicon substrate is present according to the first pending signal and a level of the corresponding terminals of the TSVs and generate a short-circuit detection output signal; and
a leakage current cancellation circuit connected to the short-circuit detection circuit and the input driving circuit to avoid a leakage current generated by the first level voltage to flow into the silicon substrate according to the short-circuit detection output signal.

20. The TSV repair circuit of claim 19, wherein the first transmission control switch and the second transmission control switch respectively comprise:
a first P-type transistor having a control terminal to receive one of the switch signal and the opposite switch signal and a first terminal to receive the first level voltage;
a first N-type transistor having a control terminal to receive one of the switch signal and the opposite switch signal and a first terminal connected to a second terminal of the first P-type transistor;
a second N-type transistor having a control terminal to receive the input signal from one of the first chip and the second chip, a first terminal connected to a second terminal of the first N-type transistor and a second terminal to receive the second level voltage;
a second P-type transistor having a control terminal to receive the input signal from one of the first chip and the second chip, and a first terminal to receive the first level voltage;
an inverter having an input terminal to receive the switch signal;
a third P-type transistor having a control terminal connected to an output terminal of the inverter to receive one of the opposite switch signal and the switch signal, and a first terminal connected to a second terminal of the second P-type transistor, the second terminal of the first P-type transistor and the first terminal of the first N-type transistor and configured as a first output terminal of the first transmission control switch or the second transmission control switch to generate the first pending signal; and a third N-type, transistor having a control terminal connected to the output terminal of the inverter to receive one of the opposite switch signal and the switch signal, a first terminal connected to a second terminal of the third P-type transistor, the second terminal of the first N-type transistor and the first terminal of the second N-type transistor and configured as a second output terminal of the first transmission control switch or the second transmission control switch to generate the first pending signal, and a second terminal to receive the second level voltage.

21. The TSV repair circuit of claim 20, wherein the input driving circuit comprises:
a fourth N-type transistor and a fourth P-type transistor, wherein control terminals of the fourth N-type transistor and the fourth P-type transistor are configured to respectively receive the first pending signal through the first output terminal and the second output terminal of the first transmission control switch or the second transmission control switch; a first terminal of the fourth P-type transistor is configured to receive the first level voltage; a second terminal of the fourth P-type transistor is connected to a first terminal of the fourth N-type transistor and configured as an output terminal of the inverter to generate the second pending signal; and a second terminal of the fourth N-type transistor is configured to receive the second level voltage.

22. The TSV repair circuit of claim 19, wherein the at least two TSVs comprise a first TSV and a second TSV, and,
each of the data path modules comprises two data path circuits to respectively transmit two transmission signals to one of the output logical circuits.

23. The TSV repair circuit of claim 22, wherein each of the output logical circuits comprises:
a first OR gate having a first input terminal and a second input terminal to respectively receive two transmission signals through the terminals of the first TSV and the second TSV at the same side in the any one chip, and an output terminal to generate each of the corresponding output signal.

24. The TSV repair circuit of claim 22, wherein the at least two TSVs further comprise a third TSV, and each of the data path modules further comprises a third data path circuit, each of the data path circuits in each of the data path modules respectively transmits three transmission signals to one of the output logical circuits.

25. The TSV repair circuit of claim 24, wherein each of the output logical circuits comprises:
a second OR gate having a first input terminal, a second input terminal and a third terminal to respectively receive three transmission signals through the terminals of the first TSV, the second TSV and the third TSV at the same side in the any one chip, and an output terminal to generate each of the corresponding output signal.

26. The TSV repair circuit of claim 19, wherein the leakage current cancellation circuit comprises:
a power control circuit connected to the short-circuit detection circuit to determine whether to stop providing the first level voltage to the input driving circuit according to the short-circuit detection output signal.

27. The TSV repair circuit of claim 26, wherein the power control circuit comprises:
a first switch having a first terminal to receive the first level voltage, a second terminal connected to a power terminal of the input driving circuit, and a control terminal to receive the short-circuit detection output signal.

28. The TSV repair circuit of claim 27, wherein the power control circuit further comprises:
a first inverter and a second inverter, the control terminal of the first switch receives the short-circuit detection output signal through the first inverter and the second inverter.

29. The TSV repair circuit of claim 19, wherein the leakage current cancellation circuit comprises:
a short-circuit protection circuit connected to the short-circuit detection circuit and one of the at least two TSVs to determine whether to turn on the corresponding terminal of the at least one TSV to the second level voltage according to the short-circuit detection output signal, wherein the first level voltage is greater than the second level voltage.

30. The TSV repair circuit of claim 29, wherein the short-circuit protection circuit comprises:
a second switch having a first terminal connected to the corresponding terminals of the at least two TSVs, a second terminal connected to the second level voltage, and a control terminal to receive the short-circuit detection output signal.

31. The TSV repair circuit of claim 19, wherein the short-circuit detection circuit comprises:
a first NOR gate having a first input terminal connected to the corresponding terminals of the at least two TSVs, a second input terminal to receive the first pending signal, and an output terminal to generate the short-circuit detection output signal.

32. The TSV repair circuit of claim 19, wherein the data path circuit further comprises:
a bias circuit having a first terminal connected to an output terminal of the short-circuit detection circuit to maintain a bias voltage of the short-circuit detection output signal.

33. The TSV repair circuit of claim 32, wherein the bias circuit comprises:
a bias resistor having a first terminal connected to the output terminal of the short-circuit detection circuit, and a second terminal to receive the second level voltage.

34. The TSV repair circuit of claim 32, wherein the bias circuit comprises a fifth N-type transistor having a first terminal and a control terminal connected to the output terminal of the short-circuit detection circuit, and a second terminal to receive the second level voltage.

35. The TSV repair circuit of claim 32, wherein the bias circuit comprises a fifth P-type transistor having a first terminal connected to the output terminal of the short-circuit detection circuit, and a second terminal and a control terminal to receive the second level voltage.

36. A through silicon via (TSV) repair circuit, comprising:
a plurality of chips stacked on top of each other, and the plurality of chips comprise a first chip and a second chip;
a first transmission control switch and a second transmission control switch respectively disposed on the first chip and the second chip, wherein the first transmission control switch and the second transmission control switch respectively receive a switch signal and an opposite switch signal as to determine whether to inverse an input signal of one of the first chip and the second chip into a first pending signal, transmit the first pending signal to an output terminal and turn off the input signal of another one of the first chip and the second chip;

at least two TSVs respectively passed through a silicon substrate to transmit signals between the plurality of chips; and a plurality of data path modules, each of the data path modules is respectively disposed on all chips, wherein each of the data path modules comprises at least two data path circuits having a same input terminal, an input terminal of each of the data path modules is connected to the first transmission control switch and the second transmission control switch respectively to receive the first pending signal, or an input terminal of each of the data path modules is configured to receive an output signal from a previous-stage chip, and an output terminal of each of the data path circuits in each of the data path modules is connected to terminals of the at least two TSVs leading to a corresponding chip, so as to transmit data through the at least two TSVs according to one of the switch signal and the opposite switch signal; and a plurality of output logical circuits respectively disposed on each of the all chips, wherein at least two input terminals of the output logical circuits are connected to terminals of the at least two TSVs at a same side in each of the all chips to receive at least two transmission signals, so as to generate a corresponding output signal from an output terminal of the output logical circuits wherein each of the data path circuits comprises:
an input driving circuit to receive the input signal, inverse the first pending signal into a second pending signal according to a first level voltage and a second level voltage and transmit the second pending signal to corresponding terminals of the TSVs;

a short-circuit detection circuit connected to the corresponding terminals of the TSVs to detect whether short-circuit on the one of at least two TSVs and a silicon substrate is present according to the first pending signal and levels of the corresponding terminals of the TSVs and generate a short-circuit detection output signal; and a leakage current cancellation circuit connected to the short-circuit detection circuit and the input driving circuit to avoid a leakage current generated by the first level voltage to flow into the silicon substrate according to the short-circuit detection output signal.

37. The TSV repair circuit of claim 36, wherein the first transmission control switch and the second transmission control switch respectively comprise:

a first P-type transistor having a control terminal to receive one of the switch signal and the opposite switch signal and a first terminal to receive the first level voltage;

a first N-type transistor having a control terminal to receive one of the switch signal and the opposite switch signal and a first terminal connected to a second terminal of the first P-type transistor;

a second N-type transistor having a control terminal to receive the input signal from one of the first chip and the second chip, a first terminal connected to a second terminal of the first N-type transistor and a second terminal to receive the second level voltage;

a second P-type transistor having a control terminal to receive the input signal from one of the first chip and the second chip, and a first terminal to receive the first level voltage;

an inverter having an input terminal to receive the switch signal;

a third P-type transistor having a control terminal connected to an output terminal of the inverter to receive one of the opposite switch signal and the switch signal, and a first terminal connected to a second terminal of the second P-type transistor, the second terminal of the first P-type transistor and the first terminal of the first N-type transistor and configured as a first output terminal of the first transmission control switch or the second transmission control switch to generate the first pending signal; and a third N-type transistor having a control terminal connected to the output terminal of the inverter to receive one of the opposite switch signal and the switch signal, a first terminal connected to a second terminal of the third P-type transistor, the second terminal of the first N-type transistor and the first terminal of the second N-type transistor and configured as a second output terminal of the first transmission control switch or the second transmission control switch to generate the first pending signal, and a second terminal to receive the second level voltage.

38. The TSV repair circuit of claim 37, wherein the input driving circuit comprises:

a fourth N-type transistor and a fourth P-type transistor, wherein control terminals of the fourth N-type transistor and the fourth P-type transistor are configured to respectively receive the first pending signal through the first output terminal and the second output terminal of the first transmission control switch or the second transmission control switch; a first terminal of the fourth P-type transistor is configured to receive the first level voltage; a second terminal of the fourth P-type transistor is connected to a first terminal of the fourth N-type transistor and configured as an output terminal of the inverter to generate the second pending signal; and a second terminal of the fourth N-type transistor is configured to receive the second level voltage.

39. The TSV repair circuit of claim 36, wherein one data path module and one output logical are disposed respectively to the first chip and the second chip, and two data path modules and two output logical circuits are disposed on any chip stacked between the first chip and the second chip.

40. The TSV repair circuit of claim 36, wherein the at least two TSVs comprise a first TSV and a second TSV, and, each of the data path modules comprises two data path circuits to respectively transmit two transmission signals to one of the output logical circuits.

41. The TSV repair circuit of claim 40, wherein each of the output logical circuits comprises:

a first OR gate having a first input terminal and a second input terminal to respectively receive two transmission signals through the terminals of the first TSV and the second TSV at the same side in the any one chip, and an output terminal to generate each of the corresponding output signal.

42. The TSV repair circuit of claim 40, wherein the at least two TSVs further comprise a third TSV, and each of the data path modules further comprises a third data path circuit, each of the data path circuits in each of the data path modules respectively transmits three transmission signals to one of the output logical circuits.

43. The TSV repair circuit of claim 40, wherein each of the output logical circuits comprises:

a second OR gate having a first input terminal, a second input terminal and a third terminal to respectively receive three transmission signals through the terminals of the first TSV, the second TSV and the third TSV at the same side in the any one chip, and an output terminal to generate each of the corresponding output signal.

44. The TSV repair circuit of claim 36, wherein the leakage current cancellation circuit comprises:
a power control circuit connected to the short-circuit detection circuit to determine whether to stop providing the first level voltage to the input driving circuit according to the short-circuit detection output signal.

45. The TSV repair circuit of claim 44, wherein the power control circuit comprises:
a first switch having a first terminal to receive the first level voltage, a second terminal connected to a power terminal of the input driving circuit, and a control terminal to receive the short-circuit detection output signal.

46. The TSV repair circuit of claim 45, wherein the power control circuit further comprises:
a first inverter and a second inverter, the control terminal of the first switch receives the short-circuit detection output signal through the first inverter and the second inverter.

47. The TSV repair circuit of claim 36, wherein the leakage current cancellation circuit comprises:
a short-circuit protection circuit connected to the short-circuit detection circuit and one of the at least two TSVs to determine whether to turn on the corresponding terminal of the at least two TSVs to the second level voltage according to the short-circuit detection output signal, wherein the first level voltage is greater than the second level voltage.

48. The TSV repair circuit of claim 47, wherein the short-circuit protection circuit comprises:
a second switch having a first terminal connected to the corresponding terminal of the at least one TSV, a second terminal connected to the second level voltage, and a control terminal to receive the short-circuit detection output signal.

49. The TSV repair circuit of claim 36, wherein the short-circuit detection circuit comprises:
a first NOR gate having a first input terminal connected to the corresponding terminals of the at least one TSV, a second input terminal to receive the first pending signal, and an output terminal to generate the short-circuit detection output signal.

50. The TSV repair circuit of claim 36, wherein each of the data path circuits further comprises:
a bias circuit having a first terminal connected to an output terminal of the short-circuit detection circuit to maintain a bias voltage of the short-circuit detection output signal.

51. The TSV repair circuit of claim 50, wherein the bias circuit comprises:
a bias resistor having a first terminal connected to the output terminal of the short-circuit detection circuit, and a second terminal to receive the second level voltage.

52. The TSV repair circuit of claim 51, wherein the bias circuit comprises a fifth N-type transistor having a first terminal and a control terminal connected to the output terminal of the short-circuit detection circuit, and a second terminal to receive the second level voltage.

53. The TSV repair circuit of claim 51, wherein the bias circuit comprises a fifth P-type transistor having a first terminal connected to the output terminal of the short-circuit detection circuit, and a second terminal and a control terminal to receive the second level voltage.

* * * * *